United States Patent [19]
Komino et al.

[11] Patent Number: 5,478,429
[45] Date of Patent: Dec. 26, 1995

[54] PLASMA PROCESS APPARATUS

[75] Inventors: Mitsuaki Komino, Tokyo; Yoichi Ueda, Yokohama; Youichi Deguchi, Tokyo; Satoru Kawakami, Sagamihara, all of Japan

[73] Assignee: Tokyo Electron Limited, Tokyo, Japan

[21] Appl. No.: 183,406

[22] Filed: Jan. 19, 1994

[30] Foreign Application Priority Data

| Jan. 20, 1993 | [JP] | Japan | 5-026226 |
| Feb. 10, 1993 | [JP] | Japan | 5-045783 |
| Feb. 16, 1993 | [JP] | Japan | 5-049994 |
| Feb. 16, 1993 | [JP] | Japan | 5-050226 |
| Feb. 20, 1993 | [JP] | Japan | 5-055090 |
| Feb. 24, 1993 | [JP] | Japan | 5-060988 |

[51] Int. Cl.$^6$ .................................... H05H 1/00
[52] U.S. Cl. ............... 156/345; 204/298.06; 204/298.08; 204/298.09; 204/298.15; 204/298.34; 204/298.03; 204/298.32; 118/723 E; 118/724; 118/728; 216/61; 216/71
[58] Field of Search .................. 156/345, 627.1; 204/298.03, 298.32, 298.09, 298.34, 298.06, 298.15, 298.08; 118/723 E, 723 ER, 725, 724, 728; 216/61, 71

[56] References Cited

U.S. PATENT DOCUMENTS

| 4,808,258 | 2/1989 | Otsubo et al. | 156/643 |
| 5,195,045 | 3/1993 | Keane et al. | 364/482 |
| 5,223,457 | 6/1993 | Mintz et al. | 156/643 X |
| 5,228,940 | 7/1993 | Yoneda | 156/345 |
| 5,342,471 | 8/1994 | Fukasawa et al. | 156/345 |

*Primary Examiner*—Thi Dang
*Attorney, Agent, or Firm*—Oblon, Spivak, McClelland, Maier, & Neustadt

[57] ABSTRACT

The present invention provides a plasma process apparatus wherein RF power is applied to a process gas, thereby to convert the gas into plasma for processing an object, the apparatus having a process chamber, an upper electrode located in the process chamber and having a gas-supplying section for supplying a process gas, a lower electrode located in the process chamber, having a cooling means, and opposing the upper electrode, for supporting an object, and RF power supplying means electrically connected to the lower electrode, protruding from the process chamber and connected to a RF power supply, for supplying RF power between the upper and lower electrodes, wherein the RF power supplying means includes, an outer conductive pipe surrounding the inner conductive rod and spaced therefrom, and a fixing member inserted between the inner conductive rod and the outer conductive pipe and having concaves and convexes, the inner conductive rod and the outer conductive pipe being electrically connected to an RF power supply source.

17 Claims, 15 Drawing Sheets

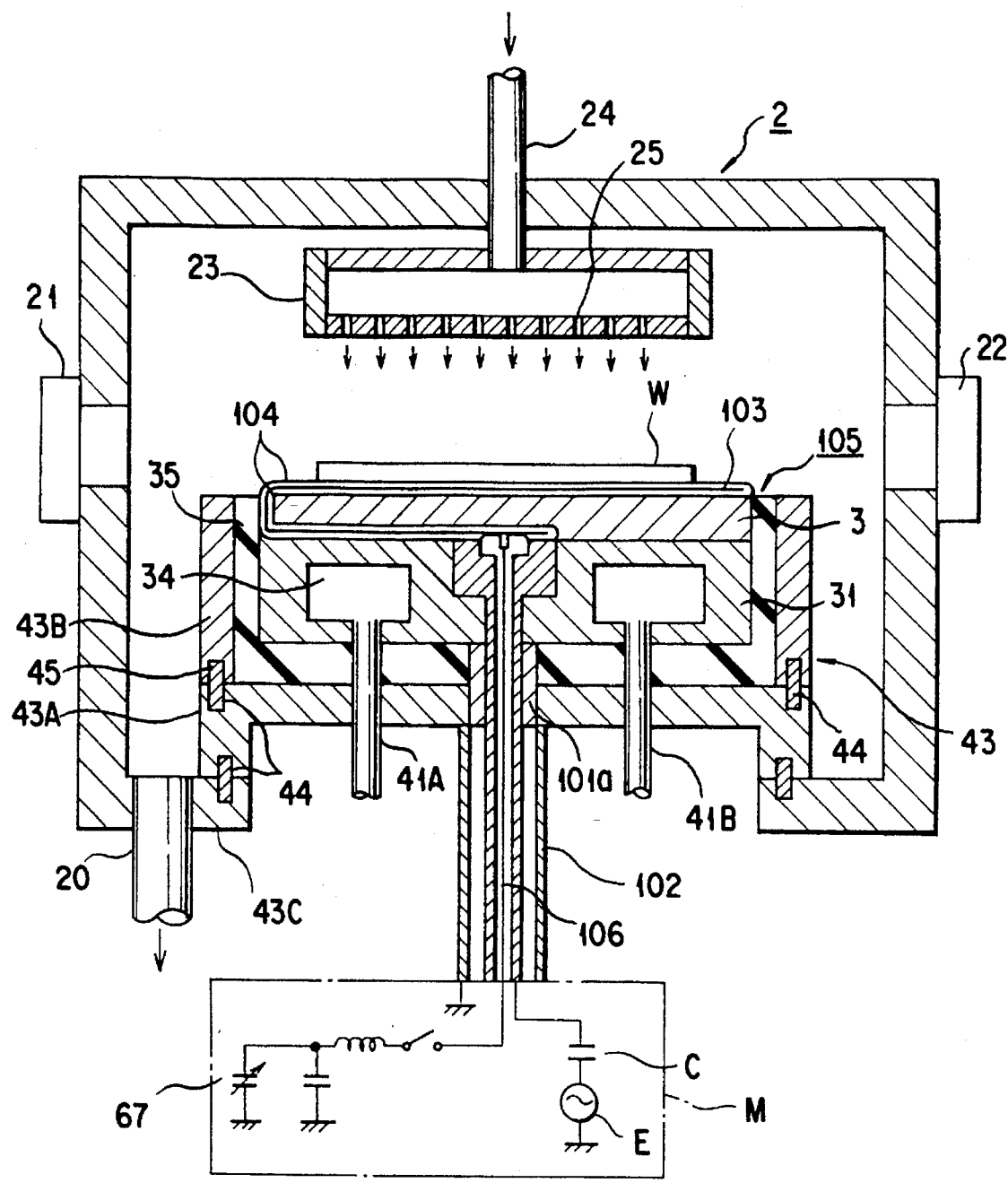
F I G. 5

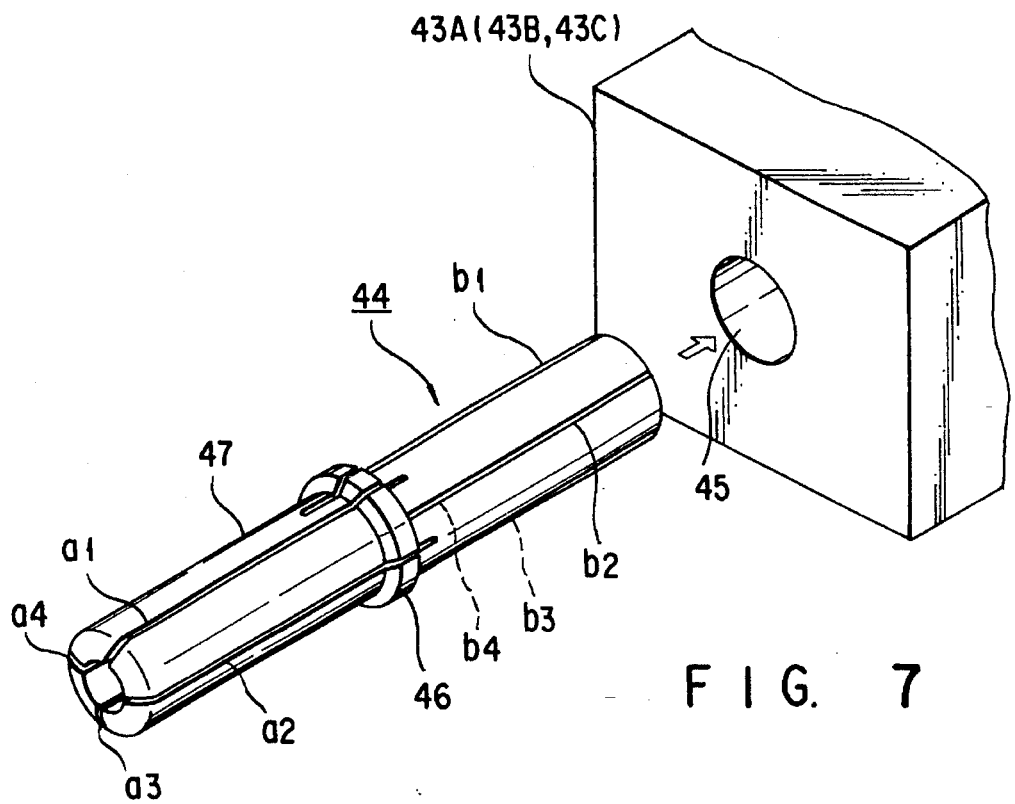
F I G. 7
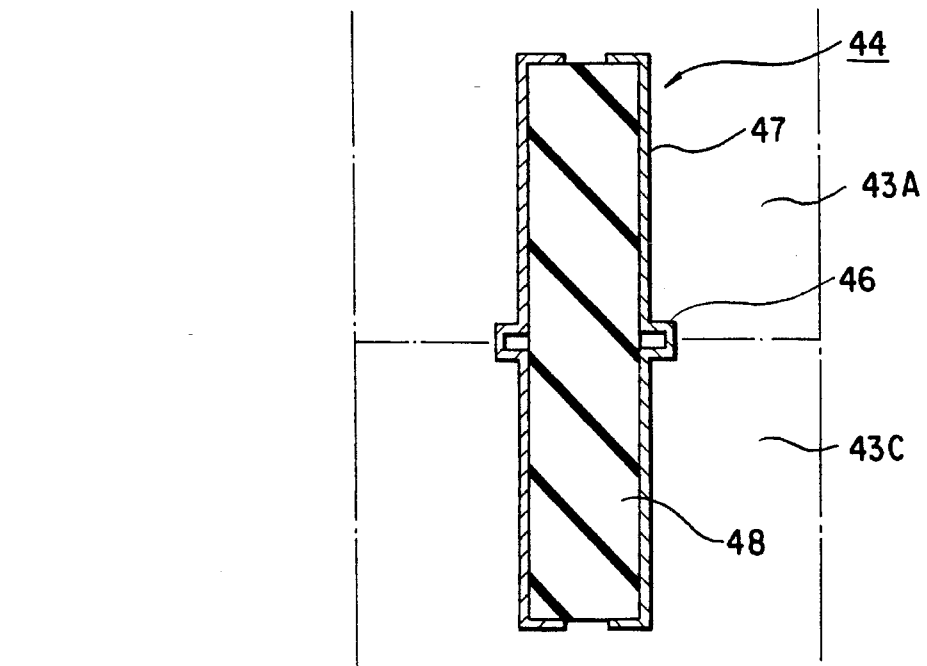
F I G. 8

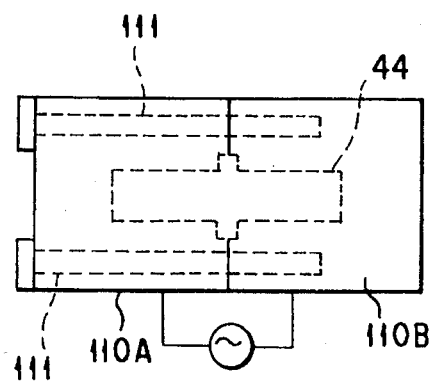
F I G. 9A
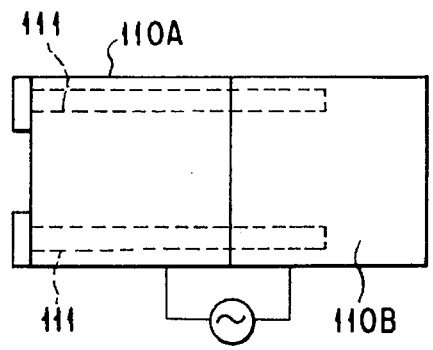
F I G. 9B
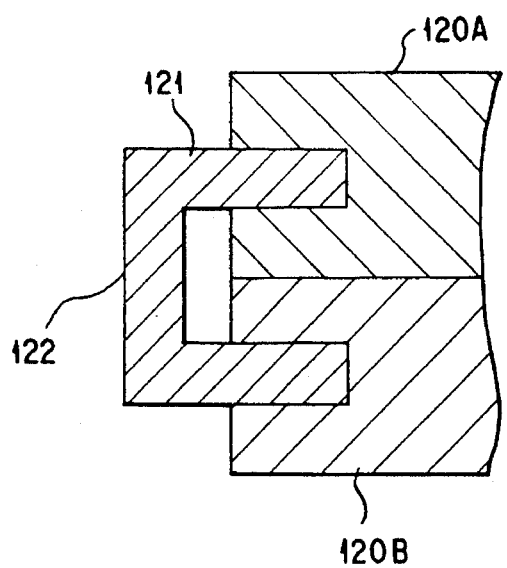
F I G. 10
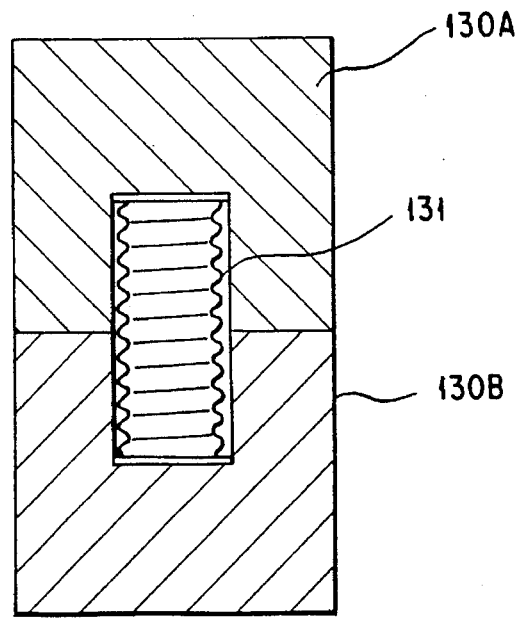
F I G. 11

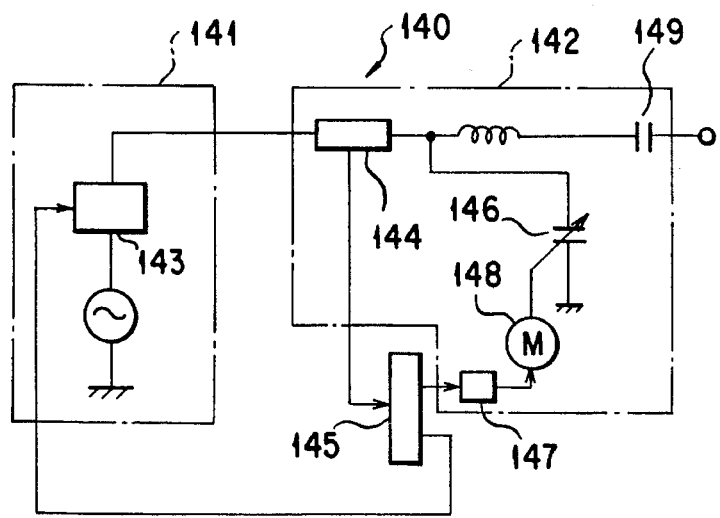
F I G. 12
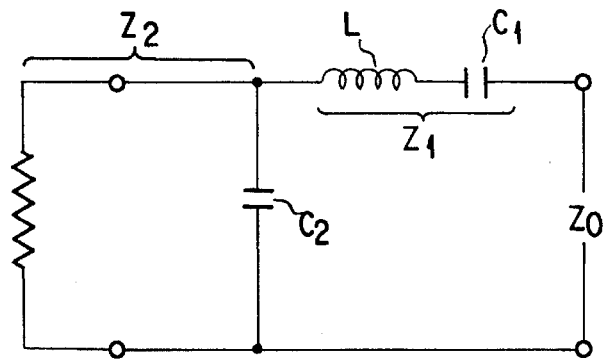
F I G. 13
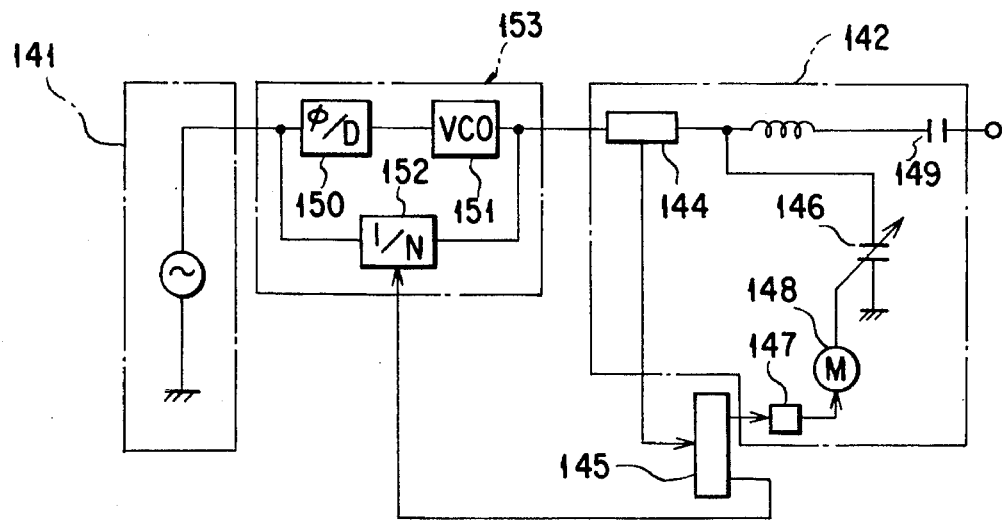
F I G. 16

| $C_1$ | $C_2$ | f |
|---|---|---|
| 20 | CONSTANT | 13.00 |
| 30 | | |
| 40 | | |
| 50 | | 14.00 |
| 60 | | MHZ |
| 80 | | |
| 100 | | |

| $C_1$ | $C_2$ | f |
|---|---|---|
| 20 | CHANGE | CONSTANT |
| 30 | (0~100%) | (13.56MHZ) |
| 40 | | |
| 50 | | |
| 60 | | |
| 80 | | |
| 100 | | |

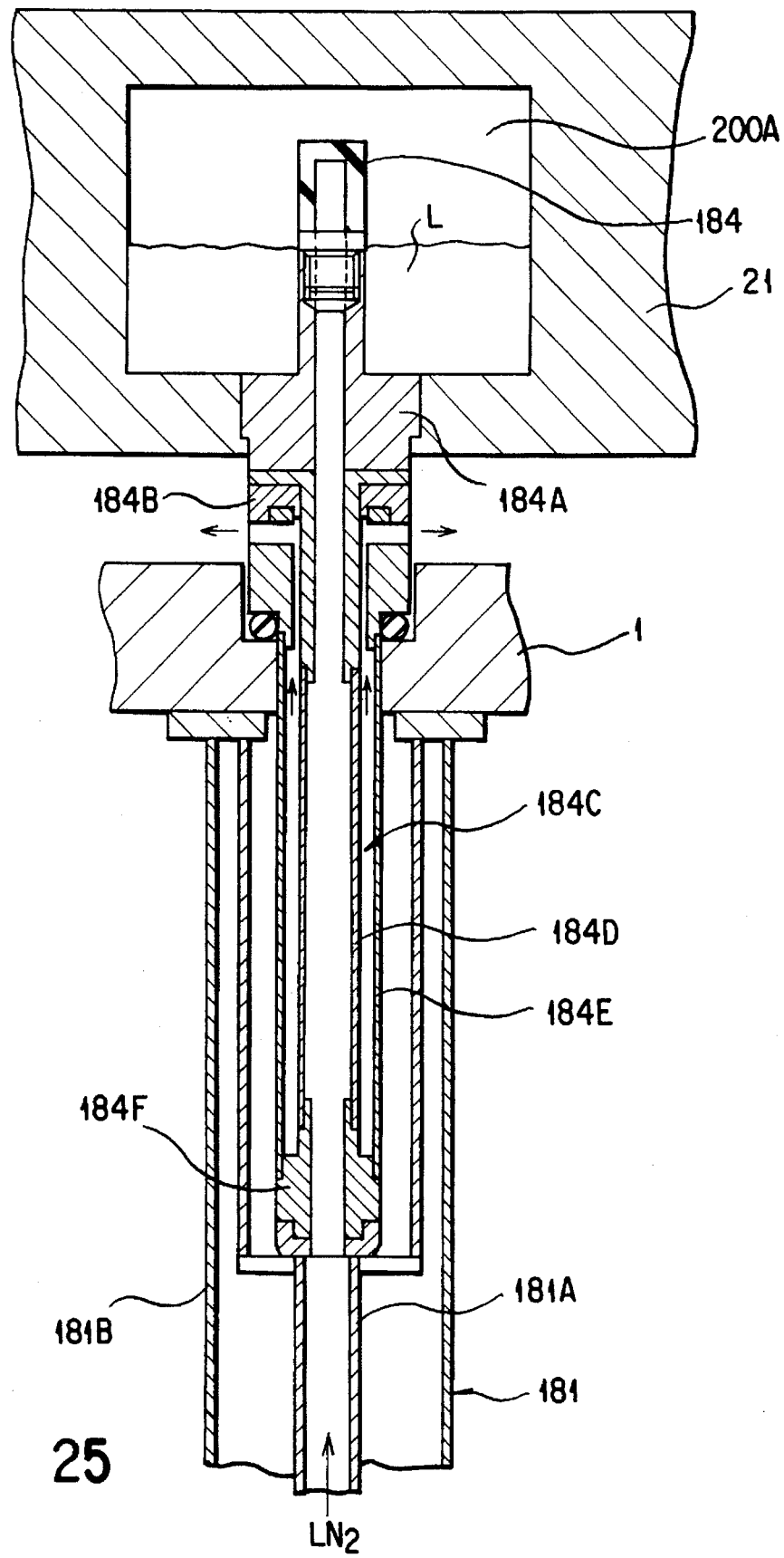
F I G. 25

PLASMA PROCESS APPARATUS

BACKGROUND OF THE INVENTION

1. Field of the Invention

The present invention relates to a plasma process apparatus.

2. Description of the Related Art

As is known, active species such as ions, complex ions, and radicals are present in a plasma obtained by electrically discharging a certain type of gas, and surface treatment of a semiconductor wafer can be presented as one of the fields in which these active specifies are used. For example, a process performed by using a plasma allows process control with high precision. For this reason, in the manufacturing process of a semiconductor wafer, plasma processes are used to perform etching and formation of various films.

As one of methods of generating a plasma, a method of applying RF power to a process gas is available. A plasma process apparatus, e.g., a signal wafer processing type etching apparatus, using this method has a lower electrode disposed in a process chamber having an airtight seal structure, and an upper electrode serving as a gas supply portion and disposed to oppose the lower electrode. This apparatus is designed to generate a plasma by applying RF power between the upper and lower electrodes so as to etch the surface of an object to be processed, e.g., a semiconductor wafer, placed on the lower electrode.

In such a conventional plasma process apparatus, a coaxial cable is used as a means for connecting a lower electrode to an RF power supply. However, a cumbersome operation is required to connect a shielded line to a process chamber, and the impedance of the apparatus may be changed depending on the manner of connecting them. In addition, Teflon used as a dielectric member for a high-power coaxial cable is expensive. For these reasons, the use of an RF power supply rod having a double-pipe structure, in place of a coaxial cable, has been considered.

FIG. 1 shows a conventional etching apparatus using such an RF power supply rod. An upper electrode 11 also serving as a gas supply portion and a lower electrode 10 having a susceptor 13 supported on a susceptor support base 12 are disposed in a process chamber 1 to oppose each other. An inner conductive rod 14 of the RF power supply rod is inserted from the lower side of the process chamber 1 to extend to the susceptor 13, and an outer conductive pipe 15 of the RF power supply rod is connected to the bottom wall of the process chamber 1. This bottom wall is electrically connected to the upper electrode 11 via the side wall of the process chamber 1.

The lower end portions of the inner conductive rod 14 and the outer conductive pipe 15 are electrically connected to an RF power supply E and the ground via a matching circuit MC in a matching box M. The lower ends of the inner conductive rod 14 and the outer conductive pipe 15 are connected to the matching circuit MC via power supply rods 14a and 15a. Referring to FIG. 1, reference numeral 16 denotes an exhaust pipe; 17 and 18, insulating portions; and 19, a cooling reservoir to which a cooling medium is circulated/supplied, and reference symbol W denotes a wafer as an object to be processed.

Below the process chamber 1, there are a pipe for circulating/supplying a cooling medium such as liquid nitrogen to the refrigerant reservoir 19, a gas inlet pipe (not shown) for supplying a backside gas to the lower surface of the wafer W, and the like. Therefore, the matching box M is located at a considerably lower position from the bottom wall of the process chamber 1, and the RF power supply rod is considerably long. If the RF power supply rod is long, as described above, the axes of the inner conductive rod 14 and the outer conductive pipe 15 are sometimes greatly shifted from each other when they are coupled to the power supply rods 14a and 15a with screws or the like.

The sizes of wafers recently tend to increase from a conventional 6-inch wafer to 8- and 12-inch wafers. In addition, the liquid crystal panel techniques have advanced rapidly, and the sizes of panels tend to increase. Apparatuses for performing processes, e.g., film formation and etching, with respect to such LCD substrates have been developed.

When a plasma process, e.g., etching, is to be performed with respect to an object to be processed, e.g., a wafer or an LCD substrate having such a large size, a high voltage corresponding to an RF power of about 4 kW is required. In this case, in designing the apparatus, an RF power supply ratio must be set to have a predetermined characteristic impedance. Therefore, the ratio of the diameter of the inner conductive rod 14 to that of the outer conductive pipe 15 is determined on the basis of this characteristic impedance. For this reason, if the RF power increases, and the axes of the inner conductive rod 14 and the outer conductive pipe 15 are shifted and brought close to each other, a discharge may occur between the inner conductive rod 14 and the outer conductive pipe 15.

If a discharge has occurred in the RF power supply rod, the supply efficiency of RF power decreases, resulting in a decrease in etching rate. In addition, the plasma becomes unstable, and impedance matching cannot be performed. As a result, a stable plasma process cannot be performed. In addition, the RF power supply rod itself is damaged by the discharge.

SUMMARY OF THE INVENTION

The present invention has been made in consideration of the above situation, and has as its object to provide a plasma process apparatus which can reliably prevent a discharge from occurring inside an RF power supply rod and which can perform impedance matching.

The object is achieved by a plasma process apparatus wherein RF power is applied to a process gas, thereby to convert the gas into plasma for processing an object, the apparatus comprising: a process chamber; an upper electrode located in the process chamber and having a gas-supplying section for supplying a process gas; a lower electrode located in the process chamber, having a cooling means, and opposing the upper electrode, for supporting an object; and RF power supplying means electrically connected to the lower electrode, protruding from the process chamber and connected to a RF power supply, for supplying RF power between the upper and lower electrodes, wherein the RF power supplying means includes an inner conductive rod, an outer conductive pipe surrounding the inner conductive rod and spaced therefrom, and a fixing member inserted between the inner conductive rod and the outer conductive pipe and having concaves and convexes, the inner conductive rod and the outer conductive pipe being electrically connected to an RF power supply source.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 5 is a sectional view showing the overall arrangement of an embodiment 2 of the present invention;

FIG. 7 is a perspective view showing a joining member used for the joining structure;

FIG. 8 is a sectional view of the joining member used for the joining structure;

FIGS. 9A and 9B show views showing comparison tests of cases wherein a joining member is used and not used;

FIGS. 10 and 11 are sectional views showing the main part of another example of the embodiment 2 of the present invention;

FIG. 12 is a schematic circuit diagram showing the main part of a plasma process apparatus according to an embodiment 3 of the present invention;

FIG. 13 is an equivalent circuit diagram of a circuit for explaining the operation principle of a control section shown in FIG. 12;

FIG. 16 is a circuit diagram for explaining a frequency conversion mechanism used for the main part shown in FIG. 12;

FIG. 25 is an enlarged sectional view of a supply portion for a lower electrode of the refrigerant supply system of the plasma process apparatus shown in FIG. 23.

DETAILED DESCRIPTION OF THE PREFERRED EMBODIMENTS

Embodiment 1

Figure 1:
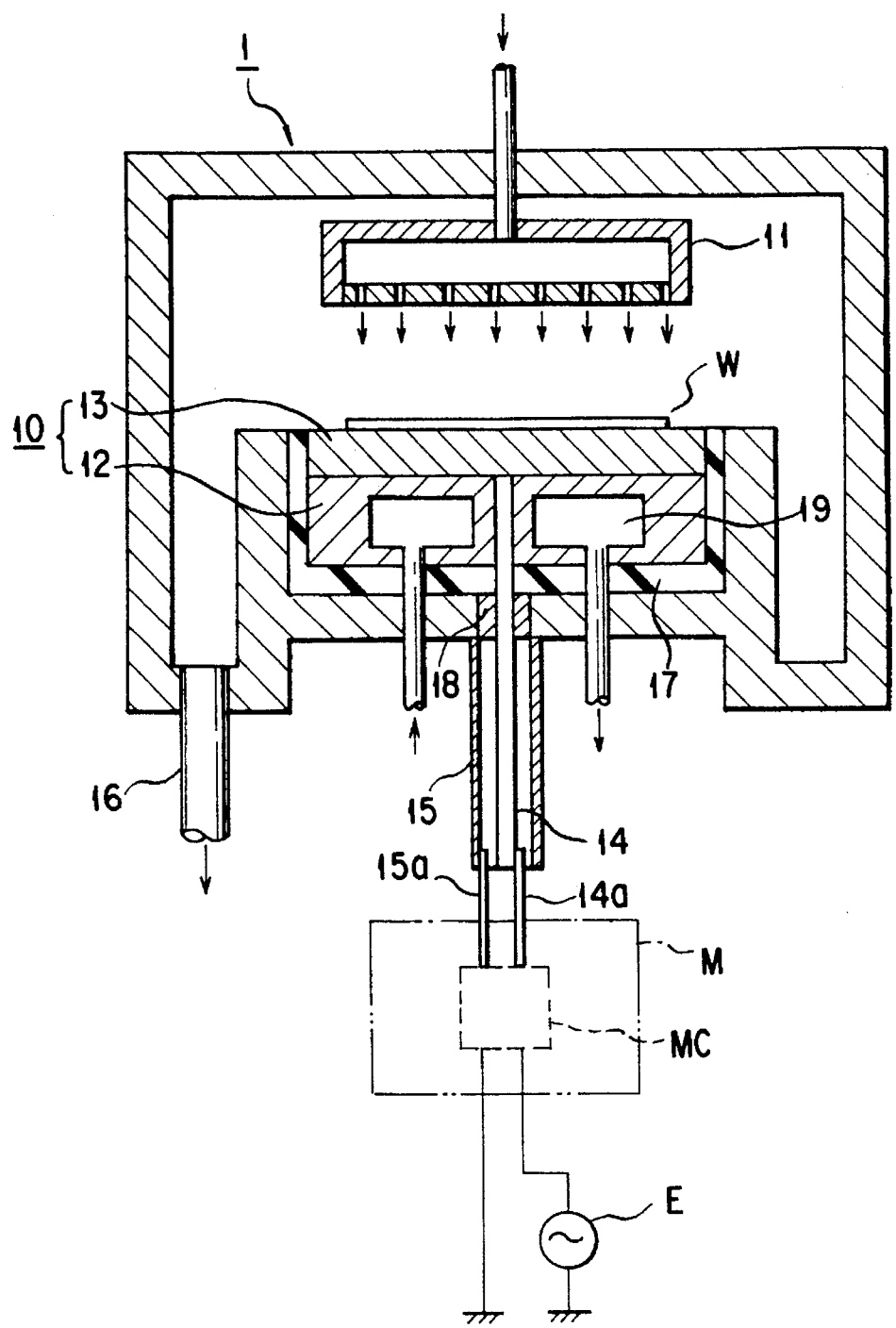
FIG. 1 is a sectional view showing a conventional plasma process apparatus (etching apparatus)
Figure 2:
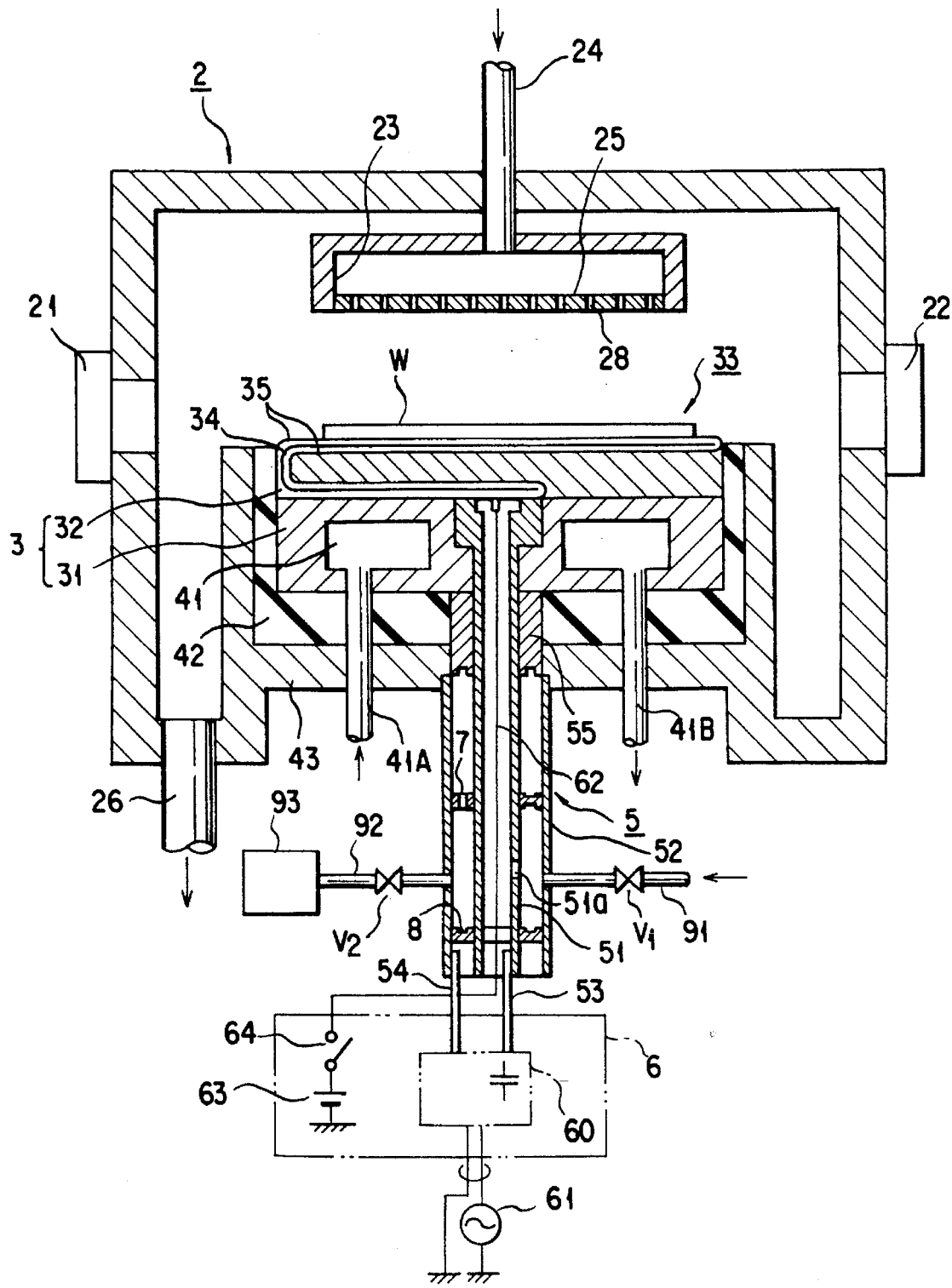
FIG. 2 is a sectional view showing the overall arrangement of an etching apparatus (plasma process apparatus) according to an embodiment 1 of the present invention.
Figure 3:
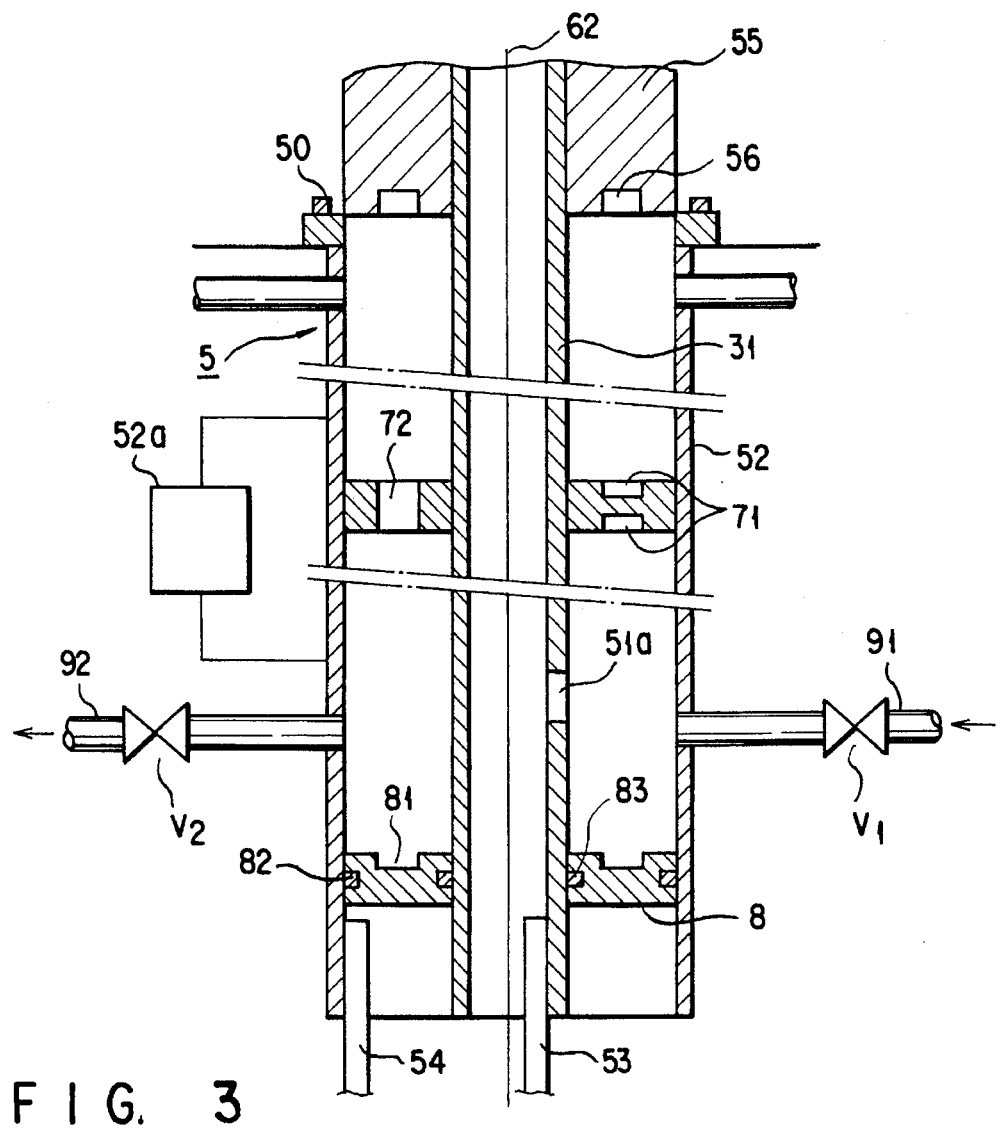
FIG. 3 is a sectional view showing a main part of the etching apparatus (plasma process apparatus) according to the embodiment 1 of the present invention.

An embodiment of the present invention will be described below. FIG. 2 is a schematic sectional view showing the overall arrangement of a plasma process apparatus, e.g., an etching apparatus, according to an embodiment 1 of the present invention. FIG. 3 is an enlarged sectional view of a main part of the embodiment. Gate valves 21 and 22 are arranged on the outer side wall of a process chamber 2 shown in FIG. 2 to airtightly seal a portion between the process chamber 2 and a load lock chamber (not shown). A susceptor support base 31 having, e.g., a columnar shape and consisting of a conductive metal, e.g., aluminum, is disposed at a central portion of the bottom surface of the process chamber 2.

A susceptor 32 consisting of a conductive metal such as aluminum is fixed on the susceptor support base 31 with, e.g., bolts. In this case, a lower electrode is constituted by the susceptor support base 31 and the susceptor 32. An electrostatic chuck sheet 33 is mounted on the upper surface of the susceptor 32. The electrostatic chuck sheet 33 is formed by coating an insulating film consisting of, e.g., a polyimide film 35, on the upper and lower surfaces of an electrode plate 34 consisting of, e.g., electrolytic copper foil. A wafer W is placed on the susceptor 32 via the electrostatic chuck sheet 33.

A refrigerant reservoir 41 for circulating a cooling medium is formed in the susceptor support base 31. Inlet and outlet pipes 41A and 41B are coupled to the refrigerant reservoir 41. A cooling medium, e.g., liquid nitrogen, supplied into the refrigerant reservoir 41 via the inlet pipe 41A is discharged via the outlet pipe 41B. A ground member 43 which is continuous with a wall portion of the process chamber 2 is disposed via an insulating portion 42.

A matching box 6 is arranged below the process chamber 1 via an RF power supply rod 5. The RF power supply rod 5 has a double-pipe structure constituted by an inner conductive rod 51 made of a tubular member and an outer conductive pipe 52 which are concentrically arranged. Each member of the RF power supply rod 5 is made of a conductive material having a low resistivity, e.g., silver or copper, to efficiently supply RF power. If each member is made of copper, the surface of the member is plated with silver. The upper end portion of the inner conductive rod 51 is joined to the lower surface of the susceptor 32, while the lower end portion of the inner conductive rod 51 is electrically connected to an RF power supply 61 via a matching circuit portion 60 including a blocking capacitor and the like arranged in the matching box 6. A vent hole 51a is formed in the pipe wall of the inner conductive rod 51 to allow a dry gas to pass through, as will be described later.

The outer surface of the upper end portion of the outer conductive pipe 52 is, for example, threaded to be threadably engaged with and electrically connected to the bottom wall (the ground member 43) of the process chamber 2. In addition, an O-ring 50 (see FIG. 3) is inserted between the outer conductive pipe 52 and the bottom wall. The lower end portion of the outer conductive pipe 52 is grounded via a power supply rod 54 and the matching circuit portion 60. An insulating ring 55 is inserted between the insulating portion 42, the ground member 43, and the inner conductive rod 51. The lower end face of the insulating ring 55 is exposed to an inner space between the inner conductive rod 51 and the outer conductive pipe 52 to seal the upper end portion of the outer conductive pipe 52. A recess portion 56 (see FIG. 3) is formed in the exposure surface in the form of a ring to surround the inner conductive rod 51.

A power supply line 62 extends through the inner conductive rod 51. The lower end of the power supply line 62 is connected to a DC power supply 63 in the matching box 6 via a switch 64, while the upper end of the power supply line 62 is electrically connected to the electrode plate 34 of the electrostatic chuck sheet 33.

Fixing members 7 and 8 for fixing the relative positions of the inner conductive rod 51 and the outer conductive pipe 52 are respectively arranged between the inner conductive rod 51 and the outer conductive pipe 52 at two positions, i.e., near the middle position of the outer conductive pipe 52 in the longitudinal direction and at the lower end portion thereof above the power supply rod 54. Each of these fixing members 7 and 8 made of a sintering member or the like is obtained by forming an insulating member, e.g., Teflon, into a ring and is fitted in the RF power supply rod 5 such that the outer surface of the fixing member is in contact with the inner surface of the outer conductive pipe 52, and the inner surface of the fixing member is in contact with the outer surface of the inner conductive rod 51.

Figure 4:
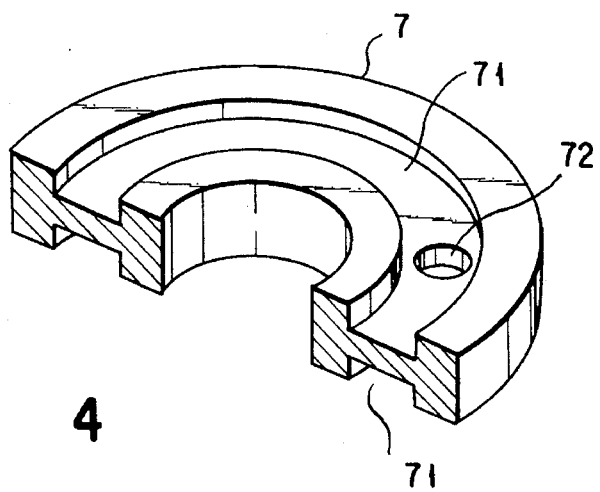
FIG. 4 is a sectional perspective view showing a fixing member used in the embodiment 1 of the present invention.

As shown in FIGS. 3 and 4, the fixing member 7 on the upper side has, for example, recess portions 71 formed in the upper and lower surfaces, at a position near the middle portion between the inner conductive rod 51 and the outer conductive pipe 52, in the form of rings extending in the circumferential direction of the RF power supply rod 5. A vent hole 72 is formed in the bottom surface of the recess portion 71 to extend through the fixing member 7.

Similarly, a recess portion 81 is formed in the upper surface of the fixing member 8 on the lower side, and O-rings 82 and 83 are inserted between the inner conductive rod 51 and the outer conductive pipe 52 to airtightly seal a space above the fixing member 8 against the atmosphere.

A gas inlet pipe 91 and an exhaust pipe 92 respectively having valves $V_1$ and $V_2$ inserted therein are connected to the outer conductive pipe 52. A gas source of a dry gas having a very low water content, e.g., $SF_6$ gas having good insulating properties, is connected to the upstream side of the gas inlet pipe 91, whereas an exhaust means 93 is connected to the downstream side of the exhaust pipe 92. Note that the exhaust means 93 may also serve as an exhaust means such as a vacuum pump for evacuating the process chamber 2. In this case, the gas inlet pipe 91 and the valve $V_1$ are parts of a gas supply means. A constant pressure means 52a is connected to the outer conductive pipe 52.

An upper electrode 23 also serving as a gas supply portion is electrically connected to the side wall of the process chamber 2, above the susceptor 32, to oppose it. A gas supply pipe 24 for supplying a process gas, e.g., $CHF_3$ or $CF_4$, and an inert gas into the process chamber 2 is connected to the upper electrode 23. In addition, a gas diffusion plate 25 for supplying a process gas into the process chamber 1 in the form of a shower is arranged on the lower surface of the upper electrode 23. An exhaust pipe 26 connected to a vacuum pump (not shown) is arranged in a lower portion of the process chamber 2. A plurality of gas supply pipes 24 and exhaust pipes 26 may be arranged in the process chamber 2 as shown in FIG. 3.

The function of the above-described embodiment will be described next. First, the valve $V_2$ of the exhaust pipe 92 connected to the outer conductive pipe 52 is opened to evacuate the outer conductive pipe 52 by the exhaust means 93. As described above, since the vent hole 72 is formed in the fixing member 7, the space above the fixing member 7 is also evacuated. In addition, since the vent hole 51a is formed in the inner conductive rod 51, the inner conductive rod 51 is also evacuated via the vent hole 51a. For example, the pressure in the RF power supply rod 5 is reduced to about $10^{-2}$ Torr. The valve $V_2$ is then closed, and the valve $V_1$ is opened to supply a dry gas, e.g., $SF_6$ gas, from a gas source (not shown) into the RF power supply rod 5. Thereafter, the valve $V_1$ is closed to set an atmosphere of $SF_2$ gas in the RF power supply rod 5 at about 2 kgf/cm².

The wafer W as an object to be processed is loaded into the process chamber 2 via the gate valve 21 by means of a convey arm (not shown), and is chucked/placed on the upper surface of the susceptor 32 via the electrostatic chuck sheet 33. The upper surface of the susceptor 32 is cooled down to a predetermined temperature, e.g., about 0° C. to −100° C., by circulating, for example, liquid nitrogen in the refrigerant reservoir 41. A process gas is supplied into the process chamber 2 via the gas supply pipe 24, the upper electrode 23, and the gas diffusion plate 25. In addition, the process chamber 2 is evacuated via the exhaust pipe 26 to maintain a predetermined pressure in the process chamber 2.

Meanwhile, for example, a 13.56-MHz, 1-kW RF power is applied through a loop constituted by the RF power supply 61, the matching circuit portion 60, the inner conductive rod 51, the susceptor 32 (lower electrode), the upper electrode 23, the wall portion of the process chamber 2, the outer conductive pipe 52, and the ground, thus generating a plasma between the upper electrode 23 and the susceptor 32. With this plasma, an etching process is performed with respect to the wafer W. Note that the frequency of the RF power supply 61 may be set to be, e.g., 40 MHz. The wafer W which has undergone the plasma process is conveyed to a load lock chamber (not shown) by a convey arm (not shown) via the gate valve 22.

According to the above-described embodiment, since ring-like fixing members 7 and 8 are arranged between the inner conductive rod 51 and the outer conductive pipe 52 at the two positions in the longitudinal positions, the axes of the inner conductive rod 51 and the outer conductive pipe 52 coincide with each other, and the distance therebetween remains the same at any positions in the longitudinal direction. That is, the inner conductive rod 51 and the outer conductive pipe 52 do not locally come close to each other. For this reason, there is no possibility that a discharge occurs through a space between the inner conductive rod 51 and the outer conductive pipe 52. In addition, since the ring-like recess portions 71 and 81 are formed in the upper and lower surfaces of the fixing members 7 and 8, the creeping distances of the fixing members 7 and 8 are large. Therefore, there is no possibility that discharges occur along the surfaces of the fixing members 7 and 8.

A lower electrode 3 is cooled by a cooling medium, as described above, so that the RF power supply rod 5 is also cooled to a considerably low temperature. However, condensation can be prevented because $SF_6$ gas is sealed in the RF power supply rod 5. Furthermore, $SF_6$ gas has good insulating properties. In consideration of these points, no discharge easily occurs between the inner conductive rod 51 and the outer conductive pipe 52.

In the above-described arrangement, the number of fixing members in the RF power supply rod 5 may be properly determined in accordance with the length of the RF power supply rod 5 and the like. For example, the number of fixing members may be one or three or more. In addition, each fixing member need not be formed throughout the circumference, but may be formed around part of the circumference. In order to increase the creeping distance of each fixing member, a projection portion may be formed instead of the recess portion, or both projection and recess portions may be formed.

Embodiment 2

FIG. 5 shows the overall arrangement of a plasma process apparatus according to an embodiment 2 of the present invention. Similar members to those shown in FIG. 2 will be designated by the same reference numerals and explanation thereof will be omitted. Referring to FIG. 5, the ground member 43 is formed as a divided structure constituted by upper and lower members, i.e., a ground member 43A on the bottom surface side and a ground member 43B on the side surface side. A joining member 44 (to be described later) is inserted in the joined portion between the two ground members 43A and 43B. Similarly, the ground member 43A on the bottom surface side is joined to a bottom wall portion 43C of the vacuum chamber 2 via the joining member 44.

An inner conductive rod 101 extends through central portions of the susceptor support base 31, the insulating member 42, and the ground member 43 (43A) from below the vacuum chamber 2. The upper end of the inner conductive rod 101 is connected to the lower electrode 3, while the lower end of the inner conductive rod 101 is connected to an RF power supply E via a blocking capacitor C in a matching box M. Note that an insulating member 101a also serving as an airtight seal is interposed between the inner conductive rod 101, the insulating member 42, and the ground member 43.

An outer conductive pipe 102 is arranged under the vacuum chamber 2 to enclose the inner conductive rod 101. The upper end portion of the outer conductive pipe 102 is connected to ground member 43 (43A), while the lower end portion of the outer conductive pipe 102 is electrically connected to ground in the matching box M. The ground member 43B is electrically connected to the side wall of the vacuum chamber 2 through a conductive member (not shown).

An electrostatic chuck sheet 105 is disposed on the surfaces of the lower electrode (susceptor) 3. The electrostatic chuck sheet 105 is formed by sandwiching an electrode plate 103, made of, e.g., a copper foil, between insulating sheets 104 consisting of, e.g., polyimide. The electrostatic chuck sheet 105 extends from an edge of the lower electrode 3 to its central portion along the lower surface. The electrode plate 103 is connected to a DC power supply 107 via a power supply line 106 extending through the inner conductive rod 101.

Figure 6:
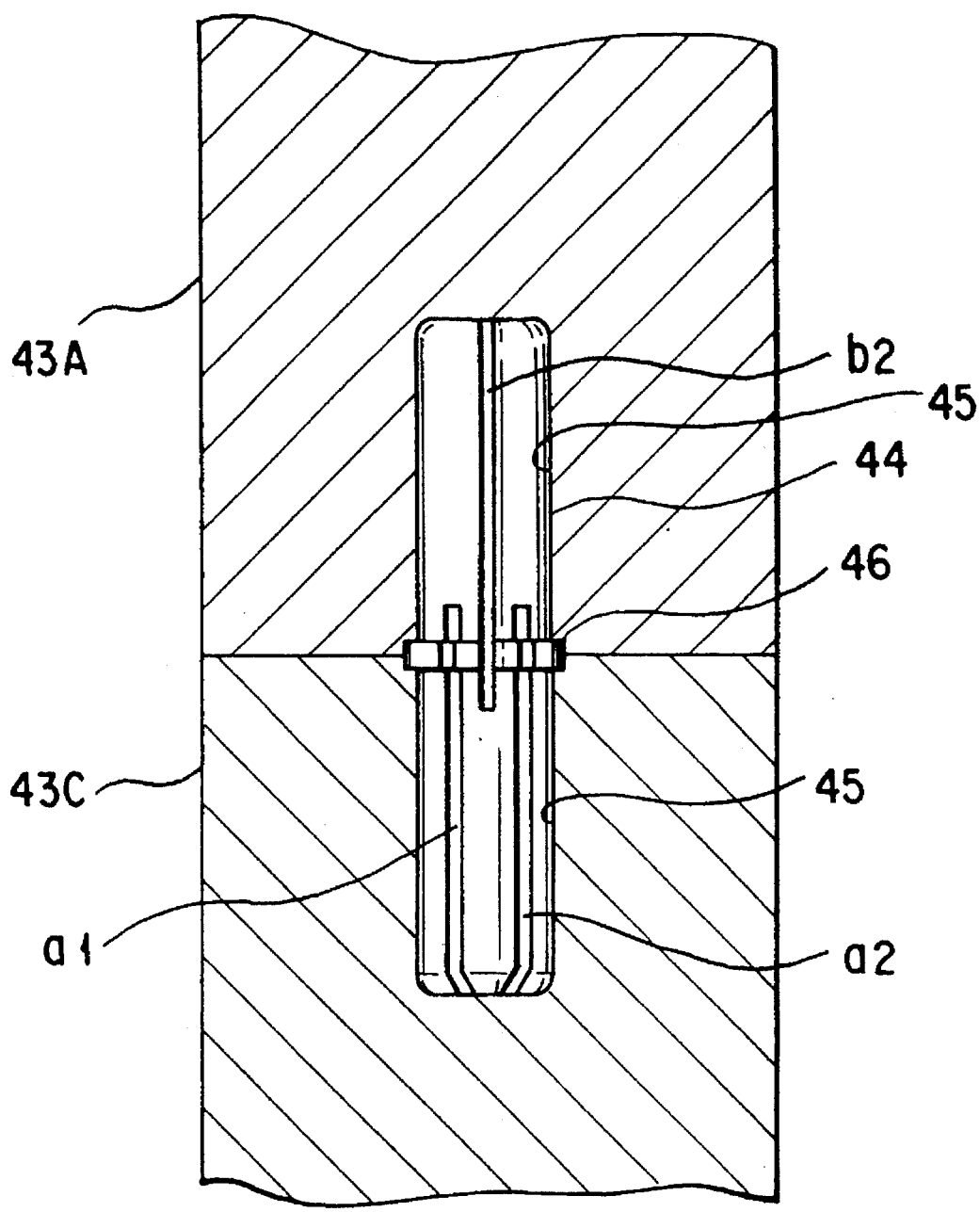
FIG. 6 is a sectional view showing a joining structure of ground members in the embodiment 2 of the present invention.

The joining structure of the ground members 43A and 43C will be described below. As shown in the enlarged view of FIG. 6, for example, recess portions 45 having the same shape are formed in the respective joining surfaces of the ground members 43A and 43C to oppose each other, and a joining member 44 is fitted in the recess portions 45. The joining member 44 is formed as follows. As shown in FIGS. 7 and 8, two ends of a cylindrical member 47 consisting of, e.g., aluminum are bent inward, i.e., toward the central axis, and a middle portion of the cylindrical member 47 is caused to protrude outward in the form of a collar such that a protruding portion 46 has a U-shaped cross-section. In addition, four elongated notched portions a1 to a4 are formed in the joining member 44 at equal angular intervals to extend from one end to portions slightly closer to the other end than the protruding portion 51 at the middle portion. Similarly, four notched portions b1 to b4 are formed in the joining member 44 at equal angular intervals and at positions shifted from those of the notched portions a1 to a4 by 45° in the circumferential direction so as to extend from the other end. Furthermore, for example, a silicone rubber 48 is sealed in the cylindrical member 47, as shown in FIG. 9.

A process performed with respect to a semiconductor wafer by the plasma process apparatus of the above-described embodiment and the function and effect of the joining structure of the ground members 43A and 43B will be described next.

A semiconductor wafer W as an object to be processed is loaded in the vacuum chamber 2 by a convey arm (not shown) via the gate valve 21 and is mounted on the wafer mount surface of the lower electrode (susceptor) 3 through a pusher pin (not shown). A process gas is supplied into the vacuum chamber 2 via the gas supply pipe 24 and the gas diffusion plate 25, and the vacuum chamber 2 is evacuated by a vacuum pump (not shown) via the exhaust pipe 26. While the vacuum chamber 2 is maintained at a predetermined internal pressure, an RF power of, e.g., 13.56 MHz and 1 kW is applied from the RF power supply E to a portion between the upper electrode 23 and the lower electrode 3 to generate a plasma. Reactive ions generated by this plasma are vertically incident on the surface of the semiconductor wafer W to cause a physical chemical reaction with a material (to be processed) on the wafer surface, thereby performing etching.

In this case, the RF current flows through the following loop: RF power supply E→inner conductive rod 101→lower electrode 3→plasma→upper electrode 23→side wall of vacuum chamber 2→ground member 43B and bottom wall portion 43C of vacuum chamber 2→ground member 43A→ outer conductive pipe 102→RF power supply E. In this loop, conductive members are arranged to be dividable. For example, as shown in FIG. 5, the ground members 43A to 43C are Joined to each other to be dividable. Owing to the use of the above-described joining member 44, variations in RF impedance between a plurality of apparatuses are small, and the rate of change in RF impedance before and after division in one apparatus is low.

The cylindrical member 47 used for the joining member 44 has the notched portions (a1 to a4 and b1 to b4) formed in the axial direction and hence has a vertically divided structure. With this structure, the cylindrical member 47 is capable of contacting in the radial direction. In addition, since the two ends of the cylindrical member 47 are bent inward, and the middle portion protrudes, the cylindrical member 47 is extendible in the vertical direction. That is, the cylindrical member 47 is an elastic structure.

For this reason, for example, if the joining member 44 is made slightly larger in size than the recess portions 45 of the ground members 43A and 43C (or 43A and 43B) and is fitted therein against the elastic force of the joining member 44, the outer surface is urged against the inner surfaces of the recess portions 45 by the elastic force (restoring force), thereby ensuring good surface contact.

The joining member 44 is not limited to the above-described structure in which the silicone rubber 48 is sealed in the cylindrical member 47. However, if the silicone rubber 48 is sealed and fitted in the recess portions 45 while the cylindrical member 47 is caused to expand, as in the above embodiment, the respective surfaces are urged against each other by the elastic effect of the silicone rubber 48. Therefore, better surface contact can be ensured. Although the RF current flows in surface portions of the conductive members, variations in RF impedance between the joined portions of the conductive members are small, and the value of each RF impedance becomes small, because the entire surface of the joining member 44 is in surface contact with the conductive members.

As a result, the generation efficiency of RF power, i.e., the plasma state, does not change much before and after maintenance of the apparatus. Therefore, no adjustment is required. Even if adjustment is required, it is performed only in a narrow range, and no great change is required. In addition, when a large number of apparatuses are to be used, variations in characteristics of devices processed by the respective apparatuses can be suppressed. Furthermore, since the power efficiency improves, an energy-saving effect can be obtained.

The following model experiments were conducted to compare an impedance Z obtained when an RF current flowed in a case wherein the conductive members were joined to each other by using the above-described joining member 44 with that obtained in a case wherein the conductive members were Joined to each other with screws.

(Test 1)

As shown in FIG. 9A, two aluminum blocks 110A and 110B, each having a cubic shape whose side is 3 cm long, were used. The blocks 110A and 110B were joined to each other by using the joining member 44 having silicone rubber sealed therein as in the above-described embodiment. The resultant structure was fixed with screws 111 at four corners, which screws were turned into the blocks in one direction. In this state, a 13.56-MHz voltage of 1 V was applied between the blocks 110A and 110B, and the impedances Z of the blocks 110A and 110B were measured. In addition, inductances L were obtained from these impedances Z. Note that the joining member 44 had a length of 40 mm and an outer diameter of 7.5 mm (the outer diameter of the protruding portion 46 was 9.0 mm, and the width of each of the notched portions (a1 to a4 and b1 to b4) was 0.5 mm.

(Test 2)

Measurement was performed in the same manner as in Test 1 except that no silicone rubber was sealed in the joining member 44.

(Test 3)

Measurement was performed in the same manner as in Test 1 except that the structure was not fixed with the screws 111.

(Test 4)

As shown in FIG. 9B, two aluminum blocks 110A and 110B, each having a cubic shape whose side was 3 cm long, (which were different from those shown in FIG. 9A in that no recess portions allowing the joining member 44 to be fitted therein were formed) were used. These blocks were fixed with screws 111 at four corners, which screws were turned into the blocks in one direction. The impedances Z and the inductances L were measured in the same manner as in Test 1.

The results of Tests 1 to 4 are summarized in Table 1.

TABLE 1

|  | Test 1 | Test 2 | Test 3 | Test 4 |
|---|---|---|---|---|
| Z (mΩ) | 21.85 | 34.48 | 45.35 | 52.69 |
| L (pH) | 152.33 | 161.37 | 448.13 | 609.12 |

Each of the above-mentioned results was obtained as an average value of a plurality of pairs of blocks. In Test 4 in which no joining member 44 was used, variations in impedance Z were larger than those in Tests 1 to 3 in which the joining member 44 was used. In addition, the value of the impedance Z was smaller when the joining member 44 was used than when the screws were used, and became smaller when silicone rubber was fitted in the joining member 44.

In joining conductive member to each other, instead of placing the joining member 44 across the opposing joining surfaces of the blocks as in the above-described embodiment, recess portions 121 may be formed in side surfaces of conductive members 120A and 120B, and two end portions of a U-shaped Joining member 122 may be respectively fitted in the recess portions 81, which end portions have, for example, an elastic structure like the one described in the above embodiment, as shown in FIG. 10.

According to the present invention, instead of using the joining member 44 used in the above embodiment, a joining member 131 made of an elastic member having two ends formed into flat surfaces, e.g., a metal bellows, may be used in such a manner that the two end faces of the joining member 131 are urged against the bottom surfaces of recess portions 45 of conductive members 130A and 130B, as shown in FIG. 11. With such a structure, since reliable surface contact can be obtained owing to the elastic force of the metal bellows, variations in impedance, i.e., variations in generation efficiency of RF power, can be reduced.

When such a metal bellows is to be used, a recess portion may be formed only in one of the joining surfaces of the conductive members, and the metal bellows may be fitted in the recess portion in such a manner that one end of the metal bellows is urged against the joining surface of the other conducive member to be in surface contact therewith.

A portion where the conductive members are joined to each other with a Joining member is not limited to the ground member at the position described in the above embodiment, and may be the upper electrode, the lower electrode, or a wall portion of the vacuum chamber. In addition, the present invention is not limited to an apparatus designed to generate a plasma in a vacuum chamber, and can be applied to an apparatus designed to generate a plasma in a gas supply path on the upstream side of a vacuum chamber and introduce the plasma into the vacuum chamber.

Embodiment 3

FIG. 12 is a circuit diagram for explaining an RF power supply unit 140 used in a plasma process apparatus according to the embodiment 3 of the present invention.

The RF power supply unit 140 is constituted by an RF power supply section 141 and a matching section 142.

An oscillation amplifier 143 having a specified frequency is arranged in the RF power supply section 141. The specified frequency of this oscillation amplifier 16 can be updated by a signal from a control section (to be described later).

A detector 144 is arranged in the matching section 142. The detector 144 serves to compare the output impedance (e.g., 50 Ω) of the oscillation amplifier 143, which is equivalent to the output impedance of the RF power supply section 141, with the input impedance of the matching section 142. The detector 144 detects the difference between the output and input impedances and outputs the detection result to a control section 145. Note that reference numeral 146 denotes a varactor. The capacitance of the varactor 146 is adjusted by a stepping motor 148 connected to a driver 147. Reference numeral 149 denotes a blocking capacitor for preventing a DC current from flowing to the RF power supply section 141.

The control section 145 performs matching of the impedances of the RF power supply section 141 and the matching section 142 as in the case of a matching circuit of this type. In this case, impedance matching is performed not only by reactance adjustment but also by adjustment of an oscillation frequency from the RF power supply section 141.

FIG. 13 is an equivalent circuit diagram showing a matching circuit. In this circuit, an impedance ($Z_0$) which changes in accordance with the state of a plasma can be obtained by calculating the sum ($Z_0 = Z_1 + Z_2$) of an inductance component ($Z_1$), adjusted by a varactor $C_2$ for adjusting an inductance, and a capacitive reactance component ($Z_2$) of a varactor $C_1$. Therefore, the output impedance of the matching circuit may be set to be equal to the input impedance which changes in accordance with the state of a plasma. The following equation can be established with regard to the above-mentioned impedance ($Z_0$).

$$Z_1 = j(\omega L - 1/\omega C_2) \quad (1)$$

$$Y_2 = 1/R + j\omega C_2 \quad (2)$$

$$Z_2 = 1/Y_2 = 1/\{(1/R) + j\omega C_1\} \quad (3)$$

$$Z_0 = Z_1 + Z_2 \quad (4)$$

where R: input impedance (fixed value; 50 Ω)
L: coil
$C_1$: capacitor
$C_2$: capacitor $$\begin{aligned} Z_0 &= j\{\omega L - 1/(\omega C_2)\} + 1/\{(1/R) + j\omega C_1\} \\ &= j\{\omega L - 1/(\omega C_2)\} + \\ &\quad \{(1/R) + j\omega C_1\}/\{(1/R)^2 + (\omega C_1)^2\} \\ &= (1 + R)/\{(1/R)^2 + (\omega C_1)^2\} + \\ &\quad j[(\omega L - 1/\omega C_2) - \omega C_1/\{(1/R)^2 + (\omega C_1)^2\}] \end{aligned}$$

where $\omega = 2\pi f$.

Therefore, by changing the frequency (f), the impedance ($Z_0$) can be changed in accordance with the impedance of the load side which changes in accordance with the state of a plasma.

In this embodiment 3, on the basis of this principle, the control section 145 performs impedance matching on the matching section 142 side by changing the oscillation frequency of the oscillation amplifier 143 in the RF power supply section 141 having an inductance component fixed, and the capacitance of the varactor $C_1$ for impedance matching in such a manner that the difference between the output impedance of the RF power supply side, detected by the detector 144, and the input impedance of the matching section 142 side is nullified. As is apparent, in this case, when frequency conversion is performed, the phase difference is fixed.

In the embodiment having the above-described arrangement, the output impedance of the RF power supply section 141 side and the input impedance of the matching section 142 side are compared with each other by the detector 144. If there is a difference between the impedances, frequency conversion in the oscillation amplifier 143 is performed through the control section 145 to nullify the difference. In addition, by replacing an inductance component with frequency conversion, the control section 145 performs capacitance adjustment only with respect to the matching varactor 146.

Figure 14:
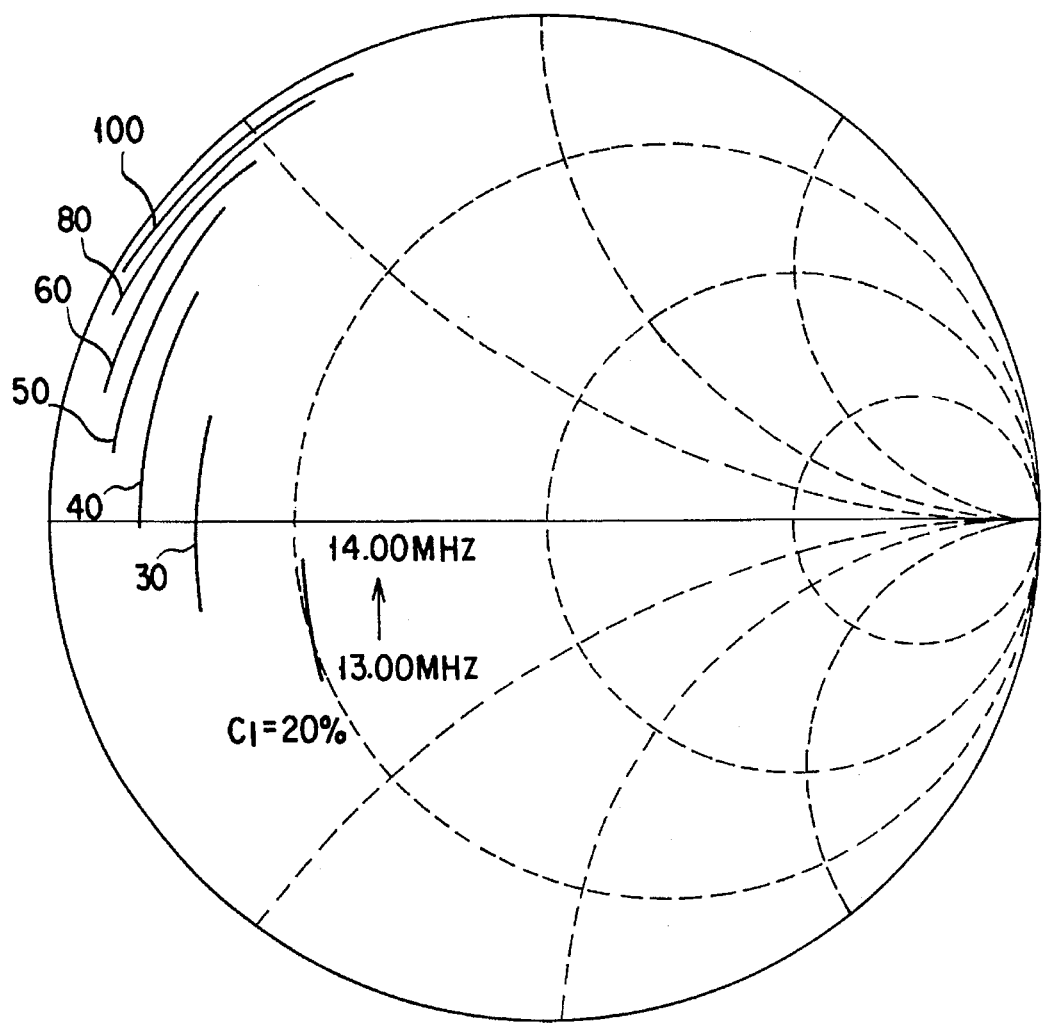
FIG. 14 is a chart showing a matched state obtained by the main part shown in FIG. 12.
Figure 14:
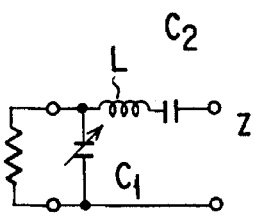

When an experiment on impedance matching in this embodiment was conducted, the result shown in FIG. 14 was obtained.

Figure 15:
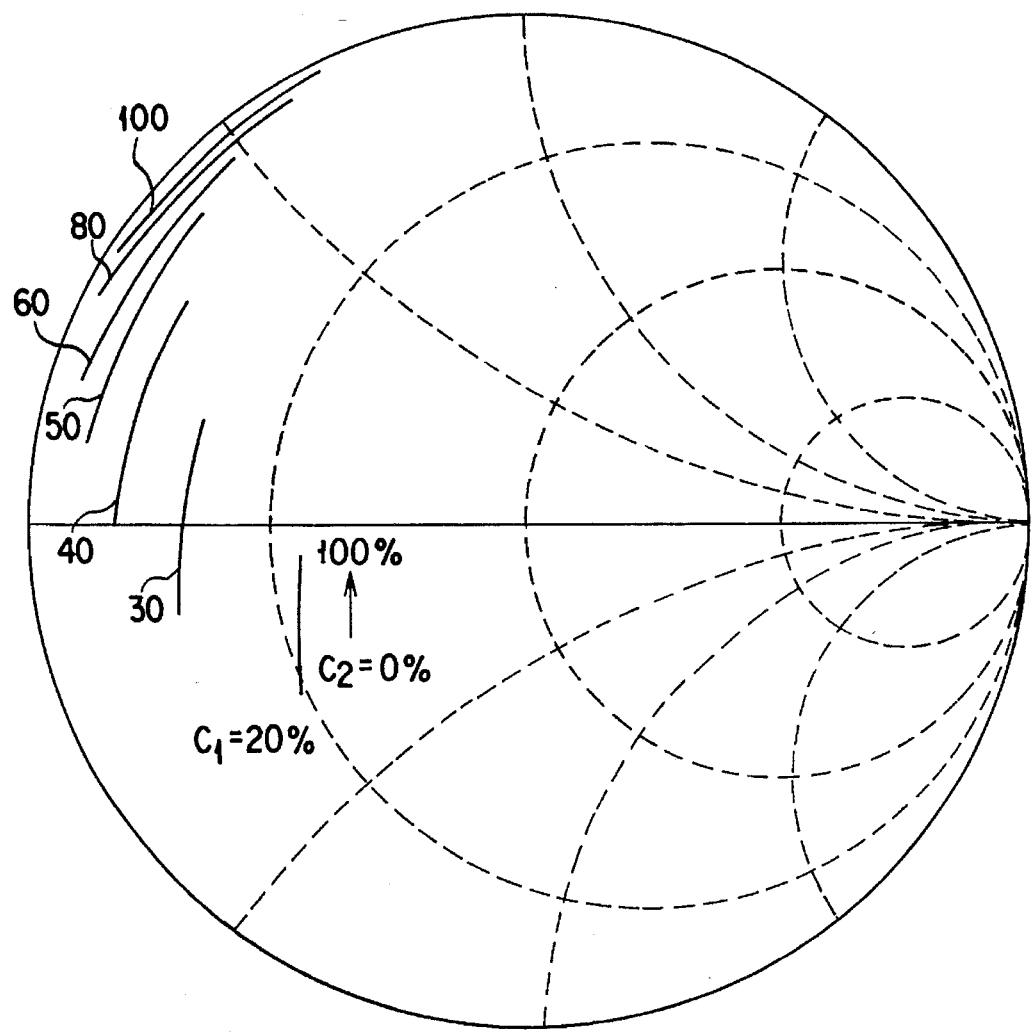
FIG. 15 is a chart showing a matched state obtained by a conventional matching circuit.
Figure 15:
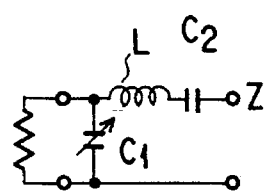

FIG. 14 shows a case wherein the oscillation frequency from the RF power supply, which has been described in the embodiment, is converted. FIG. 15 shows a case wherein the oscillation frequency is fixed to, e.g., 13.56 MHz.

In the case shown in FIG. 14, the frequency is changed, and the capacitance of the capacitor $C_1$ shown in FIG. 13 is variably changed while the capacitance of the capacitor $C_2$ is fixed. The frequency is changed within the range of 13.00 MHz to 14.00 MHz.

In the case shown in FIG. 15, the capacitance of the capacitor $C_1$ shown in FIG. 13 is changed as a parameter, and the capacitance of the capacitor $C_2$ is changed within the range of 0 to 100% with reference to the capacitance of the capacitor $C_1$.

In this setting, capacitors are selected such that $C_1=0$ to 1,500 pF corresponds to 0 to 100%; and $C_2=0$ to 500 pF, 0 to 100%.

As is apparent from FIGS. 14 and 15, in the embodiment in which frequency conversion is performed, a change in impedance can be realized in a range similar to that in the conventional matching method.

As has been described above, according to the embodiment, since the portion required to adjust the capacitance of a varactor can be reduced, relative drive control need not be performed unlike the case wherein control is performed with respect to a plurality of varactors. Therefore, the response speed at which predetermined impedances are matched can be increased.

The arrangement shown in FIG. 14 is available as an arrangement for converting the oscillation frequency of the RF power supply section 141.

In the embodiment shown in FIG. 16, a frequency synthesizer 153 constituted by a phase comparator 150, a VCO 151, and a frequency divider 152 is arranged on the output side of the RF power supply section 141. In this case, the oscillation amplifier in the RF power supply section 141 is replaced with an arrangement (not shown) serving as a reference frequency oscillator. The phase comparator 150 compares the phase of a reference frequency with that of a reproduction output frequency from the frequency divider 152 to detect a phase difference. The phase difference is then input to the VCO 151. The frequency divider 152 receives a correction signal from the control section 145 shown in FIG. 12. Therefore, the output frequency reproduced by the frequency divider 152 is an output frequency capable of impedance matching, since the contents of the correction signal from the control section 145 correspond to the above-mentioned frequency used to perform impedance matching.

Embodiment 4

Figure 17:
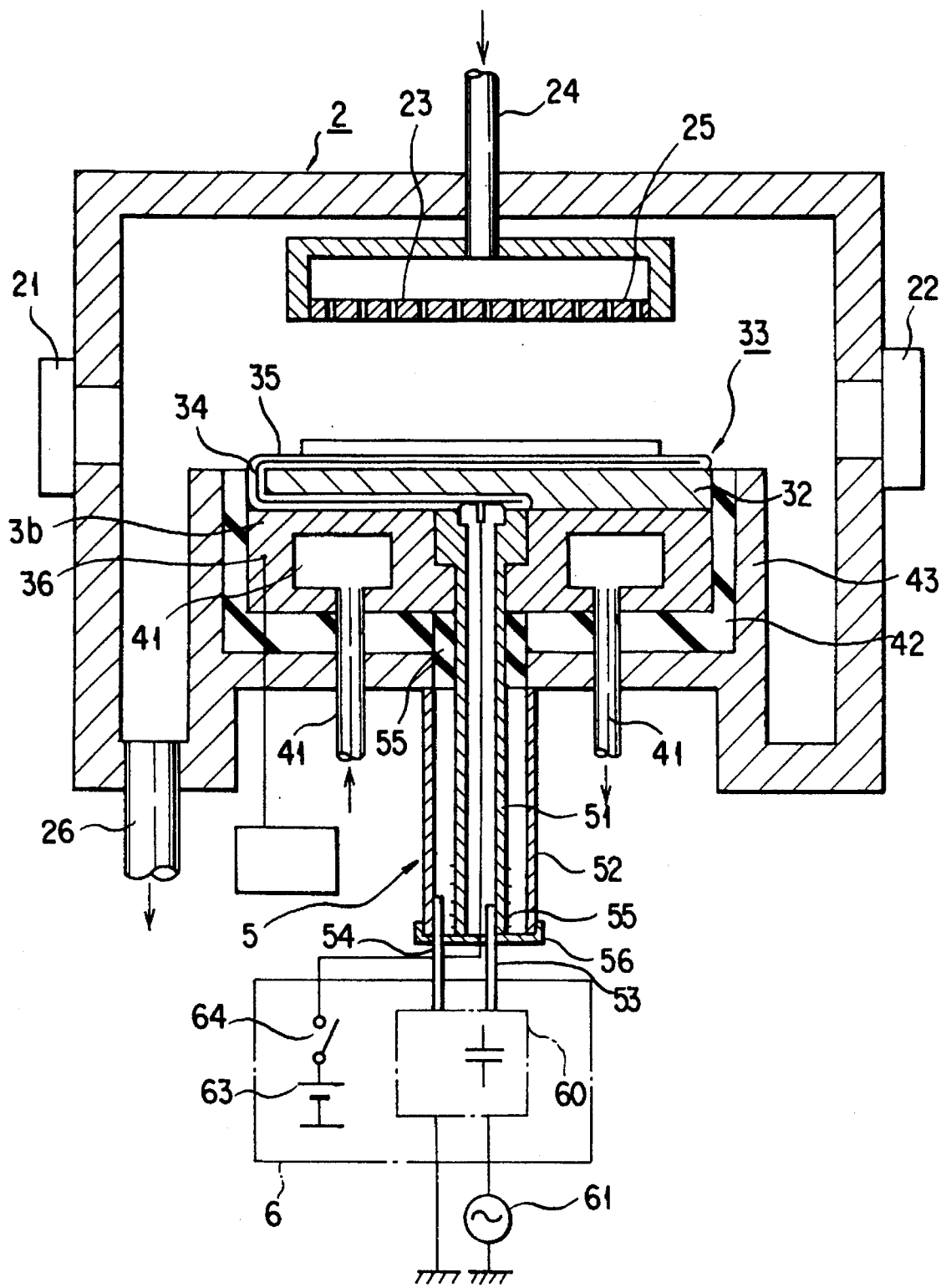
FIG. 17 is a sectional view showing the overall arrangement of an embodiment 4 of the present invention.

FIG. 17 is a schematic sectional view showing the overall arrangement of a plasma process apparatus such as an etching apparatus according to an embodiment 4 of the present invention. Similar members to those shown in FIG. 2 will be designated by the same reference numerals and explanation thereof will be omitted. A temperature monitor 36 constituted by, e.g., a fluoroptic thermometry and designed to detect the temperature of the susceptor support base 31 is arranged on the susceptor support base 31.

Figure 18:
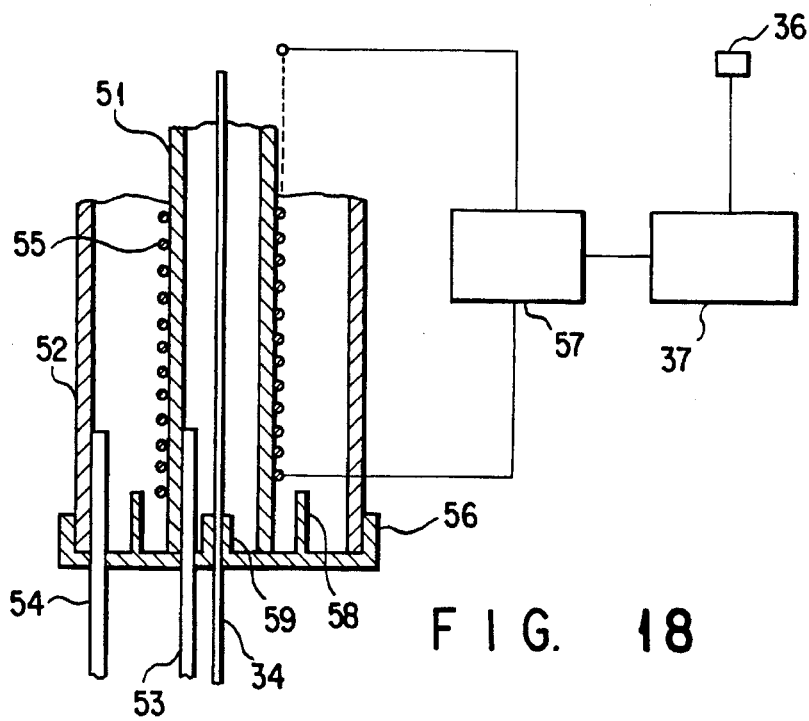
FIG. 18 is a sectional view showing the main part of the embodiment 4 of the present invention.
Figures 19, 20:
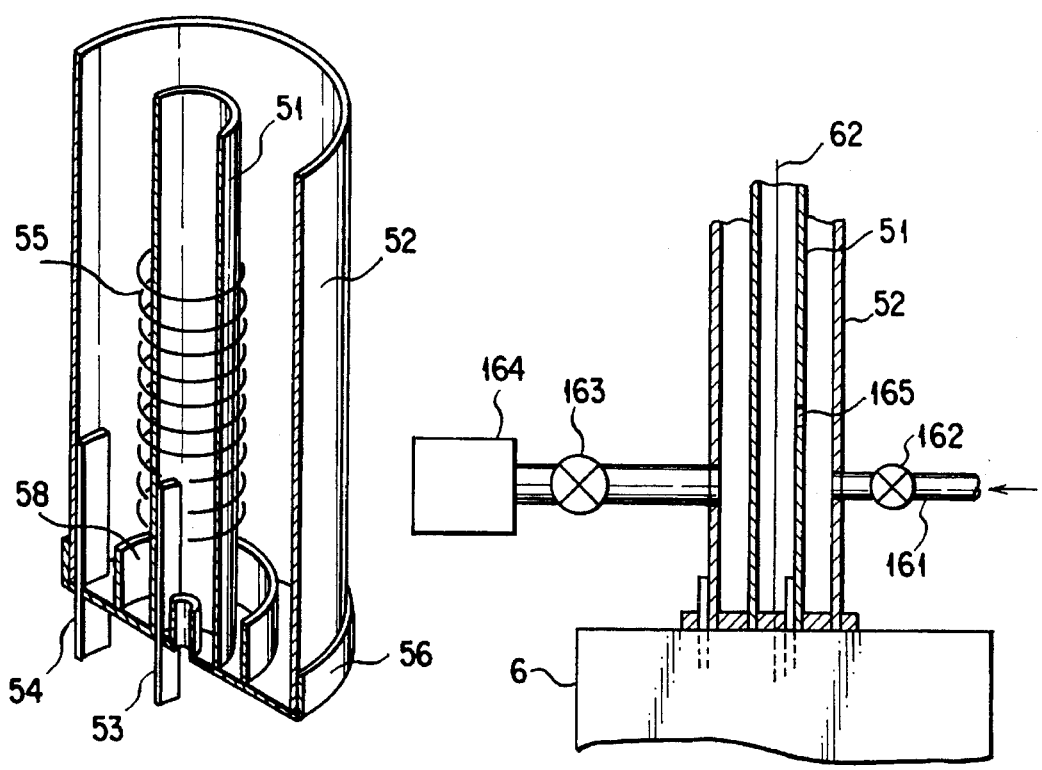
FIG. 19 is a cutaway perspective view showing the main part of the embodiment 4 of the present invention.
FIG. 20 is a view showing the main part of another example the embodiment 4 of the present invention.

A heating means, e.g., a heating wire 55, is wound around the outer surface of the inner conductive rod 51 of the RF power supply rod 5. The heating wire 55 is connected to a power supply section 57, as shown in FIGS. 18 and 19. The power supply section 57 is connected to a controller 37. When, for example, a temperature detected by the temperature monitor 36 exceeds a predetermined value, the controller 37 performs control to decrease the power supplied to the controller 37 or turn off the power. Note that the controller 37 has a function of controlling the flow rate of a refrigerant and the like on the basis of a temperature detected by the temperature monitor 36.

A saucer 56 made of an insulating material is fitted on the lower end portion of the RF power supply rod 5. The saucer 56 serves to receive water drops falling via the pipe wall of the inner conductive rod 51 or the inner surface of the outer conductive pipe 52 and prevent the drops from falling in the matching box 6. For example, a partition wall 58 is formed on the saucer 56 to prevent the inner conductive rod 51 and the outer conductive pipe 52 from being short-circuited to each other via water remaining in the saucer 56.

The upper end portions of the power supply rods 53 and 54 are respectively coupled to the inner surfaces of the inner conductive rod 51 and the outer conductive pipe 52, and extend through the saucer 56. A power supply line 62 is also arranged in the inner conductive rod 51 to extend downward through a central projection portion 59 of the saucer 56. The lower end of the power supply line 62 is connected to a DC power supply 63, arranged in the matching box 6, via a switch 64. The upper end of the power supply line 62 is electrically connected to the electrode plate 34 of the electrostatic chuck sheet 33 at substantially the center of the lower side of the susceptor 32. For this purpose, part of the electrostatic chuck sheet 33 extends from the side wall of the susceptor 32 to the lower side, and an insulating film 35 is peeled off at substantially the center of the lower side of the susceptor 32 to expose the electrode plate 34.

The function of the above-described embodiment 4 will be described next. The semiconductor wafer W as an object to be processed is loaded into the process chamber 2 by a convey arm (not shown) via the gate valve 21, and is placed on the upper surface of the susceptor 3 via the electrostatic chuck sheet 33. A process gas is supplied into the process chamber 2 via the gas supply pipe 24, the upper electrode 25, and the gas diffusion plate 23. The process chamber 2 is then evacuated via the exhaust pipe 26 and is maintained at a predetermined internal pressure.

Meanwhile, for example, a 13.56-MHz, 1-kW RF power is applied through the following loop: RF power supply 61→matching circuit section 60→inner conductive rod 51→susceptor 32→upper electrode 25→wall portion of process chamber 2→outer conductive pipe 52→ground. With this application of the RF power, a plasma is generated between the upper electrode 25 and the susceptor 32, thus performing an etching process with respect to the semiconductor wafer W. Note that the frequency of the RF power may be set to be 40 MHz.

In this etching process, a DC voltage is applied from the DC power supply 63 in the matching box 6 to the electrode plate 34 via the switch 64, and the semiconductor wafer W is attracted/held on the susceptor 32 via the electrostatic chuck sheet 33 with the resultant electrostatic force. After the plasma process, the semiconductor wafer W is conveyed to a load lock chamber (not shown) by a convey arm (not shown) via the gage valve 22.

In this case, when the amount of a cooling medium supplied and the operation of a heater (not shown) are controlled on the basis of the monitoring operation of the temperature monitor 36, the temperature of the semiconductor wafer W on the susceptor 32 is controlled to become a desired temperature, e.g., −30° C. to −100° C.

When the susceptor support base 2 is cooled in this manner, the inner conductive rod 51, which is in contact with the susceptor support base 2, and the outer conductive pipe 52 (via the inner conductive rod 51) are also cooled. As a result, condensation occurs on the surfaces of the inner and outer walls of the inner conductive rod 51 and the outer conductive pipe 52. In order to suppress this condensation, the heating wire 55 is energized to generate heat.

In this case, since the heating wire 55 is wound around the outer surface of the inner conductive rod 51, the heat is transferred to the outer conductive pipe 52 via the inner space of the double-pipe structure so as to heat the outer conductive pipe 52. Therefore, the overall RF power supply rod 5 can be effectively heated to prevent condensation. Even if condensation actually occurs, moisture can be evaporated and removed. Furthermore, if the amount of condensation is large, and water drops flow downward via the wall surfaces of the inner conductive rod 51 and the outer conductive pipe 52, these water drops are stored in the saucer 56 arranged on the lower side of the RF power supply rod 5 and are evaporated and removed by, for example, heat generated by the heating wire 55.

In this case, when such a heating operation is to be performed, it is important that the temperature of the susceptor support base 31 does not exceed a preset temperature. An area where the heating wire 55 is wound and the energization amount are determined in consideration of such a point. Various methods can be employed to control power supply to the heating wire 55. If, for example, control of the energization amount or ON/OFF control is performed on the basis of a temperature detected by the temperature monitor 36 as in the above-described case, temperature control of the susceptor 3 is not influenced.

As described above, in the etching apparatus of this embodiment, since the heating wire 55 is provided for the RF power supply rod 5 to heat it, condensation on the RF power supply rod 5 can be prevented when the susceptor support base 31 is cooled. In addition, even if condensation has occurred, moisture can be evaporated and removed. Furthermore, since the saucer 56 is arranged on the lower side of the RF power supply rod 5, the condensed drops can be prevented from falling in the matching box 6.

In the above-described case, heating wires may be wound around both the inner conductive rod 51 and the outer conductive pipe 52. As a heating means, a means for radiating heat to the RF power supply rod 5 may be used instead of a heating wire. Furthermore, if water drops flow on the outer surface of the outer conductive pipe 52, the saucer 56 may be designed to have a larger outer diameter than the outer conductive pipe 52 so as to receive the water drops.

The another example of the embodiment 4 will be described next. As shown in FIG. 20, one end of a gas inlet pipe 161 is connected to a gas source (not shown) of a gas having a low dew point, e.g., $SF_6$, and the other end of the gas inlet pipe 161 is connected to an outer conductive pipe 52 of an RF power supply rod 5 via an opening/closing valve 162. In addition, an exhaust means 164 is connected to the outer conductive pipe 52 via an opening/closing valve 163. In this case, a gas introduction means is constituted by the gas source and the gas inlet pipe 161. As the exhaust means 164, for example, a vacuum pump or the like for evacuating a process chamber 2 is commonly used. Note that the opening/closing valves 162 and 163 are controlled by a controller 37.

The function of this embodiment will be described below. The opening/closing valve 163 is opened by a control signal from the controller 37, and the inner space of the inner conductive rod 51 of the RF power supply rod 5 and the space between the inner conductive rod 51 and the outer conductive pipe 52 are evacuated by the exhaust means 164 to set a reduced-pressure atmosphere, e.g., $10^{-2}$ Torr or less. Thereafter, the opening/closing valve 163 is closed, while the opening/closing valve 162 is opened by a control signal from the controller 37 to introduce, e.g., an $SF_6$ gas into the RF power supply rod 5. In this case, the SF6 gas is also introduced into the inner conductive rod 51 via the gas inlet port 165 to fill the entire inner space of the RF power supply rod 5. With this operation, the RF power supply rod 5 is set at almost atmospheric pressure or more, e.g., 2 kgf/cm² by using the low-dew-point gas (dry gas).

As described above, in this embodiment, a low-dew-point gas atmosphere is set in the RF power supply rod 5 to suppress adhesion of moisture to the surfaces of the inner conductive rod 51 and the outer conductive pipe 52, thereby preventing condensation of moisture on the RF power supply rod 5 when a susceptor support base 31 is cooled. Therefore, this embodiment has the same effects as those of the example described above. In addition, if a heating means is also used the heating means as shown in FIG. 17, condensation can be more efficiently prevented. A low-dew-point gas is not limited to an $SF_6$ gas. For example, air containing a very small amount of moisture may be used. Furthermore, a gas may be caused to circulate inside/outside the RF power supply rod 5, and this gas may be dried outside to be returned to the RF power supply rod 5.

Embodiment 5

Figure 21:
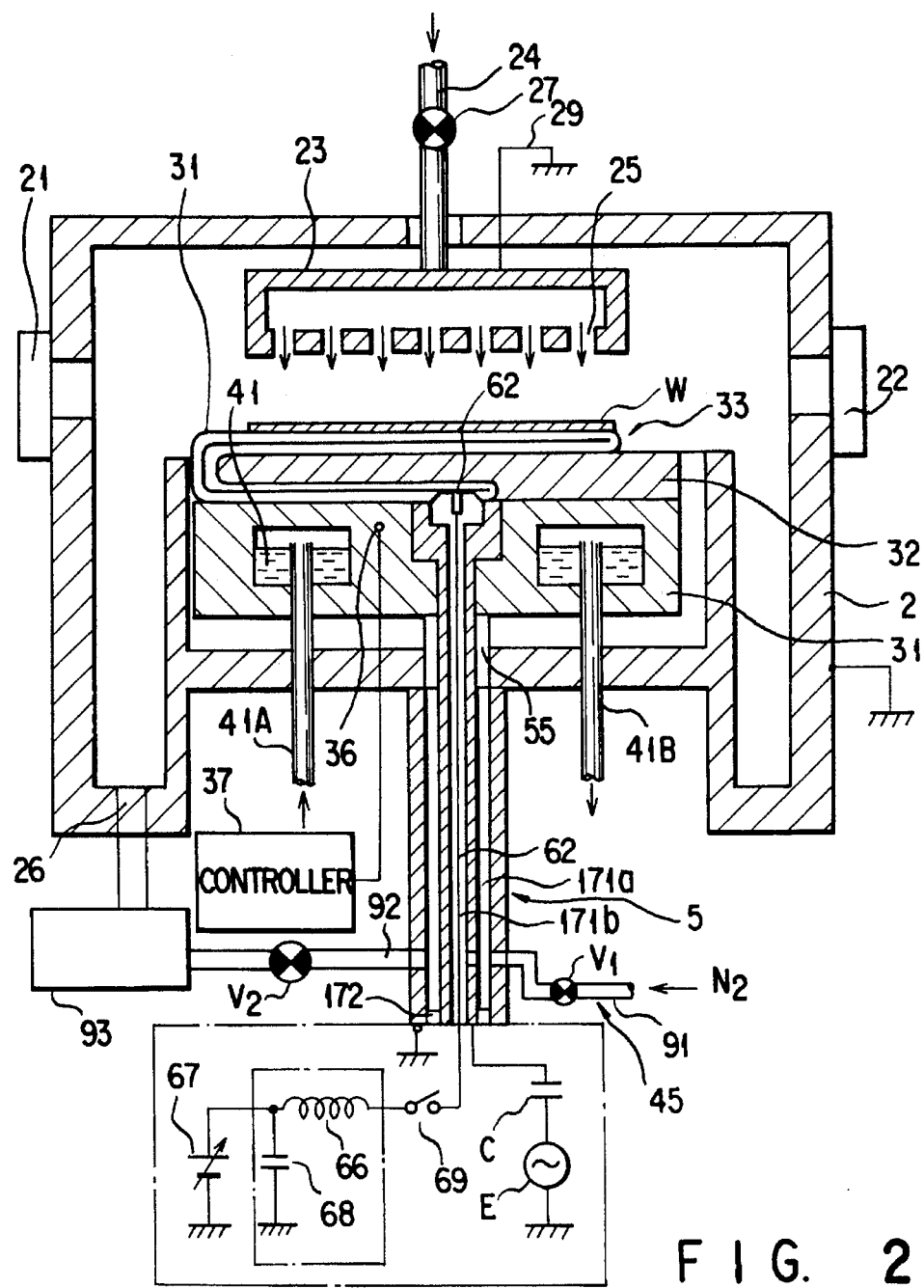
FIG. 21 is a schematic sectional view showing a plasma etching apparatus (plasma process apparatus) to which the embodiment 5 of the present invention.

FIG. 21 is a schematic sectional view showing a plasma etching apparatus to which embodiment 5 of the present invention is applied. Similar members to those shown in FIG. 2 will be designated by the same reference numerals and explanation thereof will be omitted.

In FIG. 21, the susceptor support base 31 has a temperature monitor 36, e.g., a fluoroptic thermometer. A temperature signal from the temperature monitor 36 is connected to a controller 37, and the amount of liquid nitrogen supplied to the refrigerant reservoir 41 is controlled by the controller 37. In addition, a heater (not shown) is controlled to control the temperature of the semiconductor wafer W to, e.g., 10° C. to −150° C., as needed.

Figure 22:
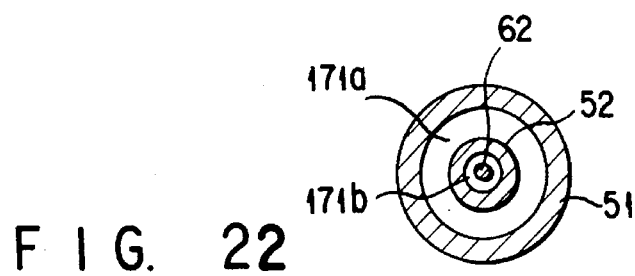
FIG. 22 is a partial sectional view showing the arrangement of a power supply rod.

In order to supply RF power having a frequency of, e.g., 13.56 MHz or 40.68 MHz and an output power of, e.g., 200 W to 3 kW to the susceptor 32 and the susceptor support base 31, an RF power supply rod 5 is arranged under the susceptor 32 to extend through an insulating ring 55, which is insulated from the process chamber 2 and airtightly seals it, and the susceptor support base 31. As shown in FIG. 22, the RF power supply rod 5 has a double-pipe structure constituted by an outer conductive pipe 52 serving as an outer pipe on the ground side and an inner conductive rod 51 serving as an inner pipe for applying RF power. A hollow portion 171a is formed between the inner conductive rod 51 and outer conductive pipe 52, and a hollow portion 171b is formed in the inner conductive rod 51.

In order to efficiently supply RF power, the inner conductive rod 51 is made of a conductive material having a low resistivity, e.g., silver or copper. If the inner conductive rod 51 is made of copper, the copper surface is plated with silver.

Sealing portions 172, each made of, e.g., a ceramic or Teflon, are arranged to provide insulation and seals for the lower end portions of the inner conductive rod 51 and outer conductive pipe 52 between the inner conductive rod 51 and outer conductive pipe 52 and in the inner conductive rod 51.

A gas inlet pipe 91 for introducing an inert gas, e.g., $N_2$, into the hollow portion 171a is formed in the outer conductive pipe 52 via an valve $V_1$, e.g., an electromagnetic valve. A hole 51a is formed in the inner conductive rod 51 to introduce the inert gas into the inner conductive rod 51 via the hollow portion 171b formed between the inner conductive rod 51 and outer conductive pipe 52.

In addition, an exhaust pipe 92 for evacuating the hollow portions 171a and 171b is formed in the outer conductive pipe 52. The exhaust pipe 92 is connected to an evacuation means, e.g., an exhaust means 93, via an valve $V_2$. The valve $V_1$ and $V_2$ are ON/OFF-controlled by a control signal from the controller 37. The outer conductive pipe 52 is arranged to enclose the inner conductive rod 51 and is connected to a bottom portion of the process chamber 2. Therefore, the outer conductive pipe 52 also serves as an RF shield. The inner conductive rod 51 is connected to an RF power supply E via a blocking capacitor C. The RF power supply E is ON/OFF-controlled by a control signal from the controller 37. The susceptor 32 and the side and bottom surfaces of the susceptor support base 31 are arranged to be covered with insulating members, e.g., ceramic members.

The electrostatic chuck sheet 33 extends to a substantially central portion between the susceptor 32 and the susceptor support base 31 along a side wall of the susceptor 32. At this substantially central portion, the polyimide film 35 of the electrostatic chuck sheet 33 is peeled off to expose the electrolytic copper foil. A power supply line 62 for applying a DC voltage, e.g., a voltage of 3 kV or less, is in contact with a power supply portion 62a. The power supply line 62 extends through the inner conductive rod 51. A coil 66 is series-connected to the power supply line 62 via a switching means, e.g., an electromagnetic switch 69. A capacitor 68 is connected between the coil 66 and the ground in parallel with a DC power supply 67. The electromagnetic switch 69 is ON/OFF-controlled by the controller 37. Note that the coil 66 has a high inductance with respect to the above-mentioned RF power to have a high electric resistance with respect to the RF power.

As shown in FIG. 21, an upper electrode 23 as a counterelectrode is disposed above the susceptor 32 in the upper portion of the process chamber 2. A process gas, e.g., $CHF_3$ or $CF_4$, or an inert gas is supplied to the upper electrode 23 via a gas supply pipe 24 and an opening/closing valve 27. The process gas is then blown toward the semiconductor wafer via a plurality of holes 28 formed in the bottom wall of the upper electrode 23. When the RF power supply E is turned on, a plasma is generated between the upper electrode 23 and the semiconductor wafer W. The upper electrode 23 is grounded by a wire 29 to be electrically grounded.

The susceptor 32 also has a pin (not shown) which is electrically grounded through a resistor or an inductance and can be moved vertically. This pin is vertically moved when the semiconductor wafer W is conveyed by the convey unit in the load lock chamber, and the semiconductor wafer W is placed or released on or from the chuck surface of the electrostatic chuck sheet 33.

An exhaust pipe 26 for evacuating the process chamber 2 is formed in a bottom portion of a side wall of the process chamber 2. The exhaust pipe 26 is connected to the exhaust means 93 via an opening/closing valve (not shown), e.g., a butterfly valve, thus constituting a plasma etching apparatus.

A function for setting the power supply rod in an inert gas atmosphere or a reduced-pressure atmosphere in the plasma etching apparatus having the above-described arrangement will be described below.

The above-mentioned inert gas is introduced into the hollow portion 171a between the inner conductive rod 51 and outer conductive pipe 52 and into the hollow portion 171b in the inner conductive rod 51 in the following manner. First, the valve $V_2$ is turned on by a control signal from the controller 37 to set a reduced-pressure atmosphere, e.g., $10^{-2}$ Torr or less, in the hollow portions 171a and 171b by using the exhaust means 93 when the apparatus is started.

The valve $V_2$ is then turned off, and the valve $V_1$ is turned on by a control signal from the controller 37, thus introducing an inert gas, e.g., an $N_2$ gas, into the hollow portion 171a.

The inert gas introduced into the hollow portion 171a is also introduced into the hollow portion 171b, formed in the inner conductive rod 51, via the gas supply pipe 91 formed in the inner conductive rod 51. As a result, in the hollow portions 171a and 171b, a highly pure inert gas atmosphere having almost atmospheric pressure or more, e.g., 2 kgf/cm$^2$ and containing no moisture is set.

Since an inert gas atmosphere is set between the ground side and RF power application side of the RF power supply rod, the amount of moisture in the air which adheres to the RF power supply rod can be reduced, thereby suppressing corrosion of the RF power supply rod.

When the temperature of the susceptor is to be set to $-30°$ C. or less by a cooling medium, e.g., liquid nitrogen, condensation of moisture in the atmosphere on the surfaces of the supply and ground pipes can be suppressed. In addition, since corrosion of the supply and ground pipes and condensation thereon can be suppressed, the efficiency of supplying RF power to the susceptor can be stabilized, thereby suppressing variations in process of objects to be processed and increasing the yield of objects to be processed.

In this embodiment, $N_2$ is used as an inert gas. It is, however, apparent that a rare gas, e.g., He, Ne, Ar, Kr, Xe, or Rn may be used as long as it is an inert gas. In addition, it is obvious that a reduced-pressure atmosphere may be maintained in the power supply rod without introducing an inert gas. Furthermore, it is obvious that an inert gas may be caused to circulate in the power supply rod by the inert gas inlet means and the exhaust means. An inert gas may be supplied to substitute the atmosphere with an inert gas atmosphere without using the evacuation means. The present invention is not limited to the above-described embodiment. Various changes and modifications can be made within the spirit and scope of the invention.

Embodiment 6

Figure 23:
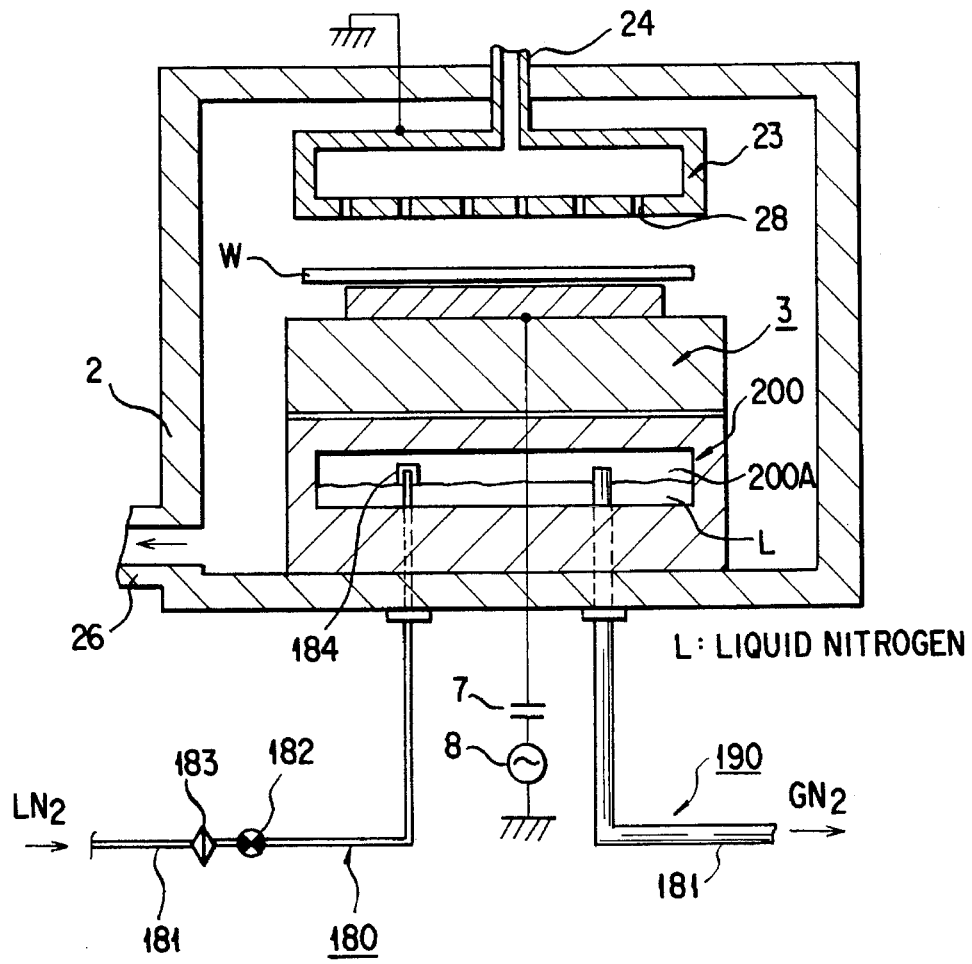
FIG. 23 is a sectional view showing the arrangement of a plasma process apparatus according to an embodiment 6 of the present invention.
Figure 24:
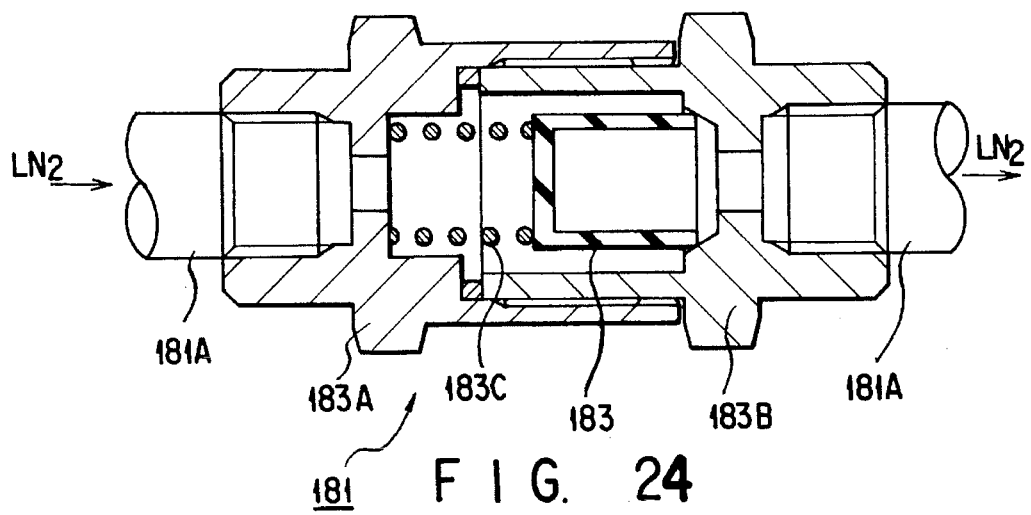
FIG. 24 is an enlarged sectional view of a filter of a refrigerant supply system of the plasma process apparatus shown in FIG. 23.

An embodiment 6 of the present invention will be described below with reference to FIGS. 23 to 25. As shown in FIG. 23, a process apparatus of the embodiment 6 comprises a process chamber 2 consisting of a conductive material such as aluminum, a lower electrode 3 arranged on the bottom surface of the process chamber 2 and also serving as a mount table on which a semiconductor wafer W as an object to be processed is mounted, and an upper electrode 23 arranged above the lower electrode 3 at a distance of, e.g., 15 to 20 mm. A refrigerant supply system 180 and a gas exhaust system 190 (both will be described later) are connected to the lower electrode 3. With this arrangement, when the semiconductor wafer W is to be processed, for example, liquid nitrogen L is supplied to the lower electrode 3 by the refrigerant supply system 180 to constantly cool the lower electrode 3, and a nitrogen gas produced upon this cooling operation is exhausted by the gas exhaust system 190.

An exhaust unit (not shown) is connected to the process chamber 2 via an exhaust pipe 26. With this exhaust unit, a reduced-pressure atmosphere, e.g., 10$^{-2}$ Torr or less, is set in the process chamber 2. In addition, an RF power supply E is connected to the lower electrode 3 via a capacitor C. RF power is applied from the RF power supply E to the lower electrode 3 to form an etching gas such as CF$_4$ into a plasma between the lower electrode 3 and the grounded upper electrode 23, thus producing active species such as ions and radicals. The upper electrode 23 has a hollow portion. A gas supply pipe 24 for supplying an etching gas into the hollow portion is connected to the upper surface of the upper electrode 23. A plurality of holes 28 for blowing the etching gas are distributively formed in the lower surface of the upper electrode 23. The etching gas is supplied into the process chamber 2 via the plurality of holes 28, and the semiconductor wafer W is etched by active species such as ions and radicals produced by a discharge between the lower electrode 2 and the upper electrode 23.

As shown in FIG. 23, the refrigerant supply system 180 comprises a supply pipe 181 serving as a supply path for the liquid nitrogen L from a liquid nitrogen bomb, and a driving mechanism, e.g., an electromagnetic valve 182, arranged in the supply pipe 181 and designed to adjust the flow rate of the liquid nitrogen L to a predetermined amount. The supply pipe 181 is designed to have a double-pipe structure constituted by a stainless steel inner pipe 181A and a stainless steel outer pipe 181B as shown in FIG. 25. A filter 183 is provided for the inner pipe 181A to be located on the upstream side of the electromagnetic valve 182. FIG. 24 is an enlarged view of the filter 183. Referring to FIG. 24, the filter 183 is elastically interposed between coupling members 183A and 183B of the inner pipe of the supply pipe 181 via a coil spring 183C. The liquid nitrogen L flowing from the left is filtered by the filter 183 to stop particle-like substances such as frozen particles (e.g., fine frozen particles of water) contained in the liquid nitrogen L, and is then made to flow to the right, thereby preventing the fine frozen particles from adhering to the inner wall of the electromagnetic valve 181 and the driving portion located on the downstream side of the filter 183, or preventing fine frozen particles adhering to the electromagnetic valve 181 from growing and interfering with the operation of the electromagnetic valve 181. In addition, the filter 183 serves to prevent fine frozen particles from adhering to and growing on the inner wall of the inner pipe 181A located on the downstream side of the filter 183. If the gas pressure in a cooling block 200 rises abnormally, the gas pressure is absorbed by the coil spring 183C. The filter 183 is made of a sintered metal such as bronze or stainless steel as an assembly of many capillaries communicating with each other, and is designed to stop particle-like substances in the liquid nitrogen L and allow only the liquid nitrogen L to pass, as described above.

The downstream end of the supply pipe 181 is located at a position where it protrudes from the liquid surface of the liquid nitrogen L in a refrigerant reservoir portion 200A of the cooling block 200. A gas/liquid separating member 184 made of a sintered metal formed in the same manner as that for the filter 183 is mounted at the downstream end of the supply pipe 181. A nitrogen gas which is produced when the liquid nitrogen is gasified in the process of flowing through the supply pipe 181 is separated from the liquid nitrogen in the gas/liquid separating member 184 in the refrigerant reservoir portion 200A. The nitrogen gas is then dispersed in the space above the liquid nitrogen L, and the liquid nitrogen L is supplied smoothly so as not to disturb the liquid surface of the liquid nitrogen L.

The gas/liquid separating member 184 is formed to have a cylindrical shape with its upper end being closed. The lower end of the gas/liquid separating member 184 is coupled to the downstream end of the inner pipe 181A of the supply pipe 181 via an upper coupling member 184A, a lower coupling member 184B, and a pressure reducing double pipe 184C so as to prevent heat from entering from a portion near the downstream end of the supply pipe 181. The pressure reducing double pipe 184C is constituted by an inner pipe 184D made of a material, e.g., a ceramic material, having a small thermal expansion coefficient and excellent electrical insulating properties, an outer pipe 184E made of the same material as that for the inner pipe 184D, and a sealing member 184F for sealing the lower end of a space defined between the pipes 184D and 184E. With this arrangement, the space between the inner and outer pipes 184D and 184E is evacuated upon communication with the process chamber 2, and the interior of the inner pipe 184D serves as a supply path for the liquid nitrogen L.

An exhaust pipe 191 of the gas exhaust system 190 has a pressure reducing double pipe (not shown) having the same arrangement as that of the pressure reducing double pipe 184C. The upstream end of the exhaust pipe 191 is located at a position where it protrudes from the liquid surface of the liquid nitrogen L stored in the refrigerant reservoir portion 200A, as shown in FIG. 23, so as to exhaust a nitrogen gas formed upon gasification of the liquid nitrogen in the refrigerant reservoir portion 200A. In addition, a level meter (not shown) for monitoring the level of the liquid nitrogen L is arranged in the refrigerant reservoir portion 200A. The electromagnetic valve 182 of the refrigerant supply system 180 is ON/OFF-controlled on the basis of a monitoring result obtained by the level meter, thus always holding a predetermined amount of the liquid nitrogen L in the refrigerant reservoir portion 200A as the liquid nitrogen L is consumed.

The operation of the embodiment will be described next. The semiconductor wafer W is placed on the lower electrode 3 in the process chamber 2 which is set in a reduced-pressure state of, e.g., $10^{-2}$ Torr or less. RF power is then applied to the lower electrode 3 to form a discharge space between the lower and upper electrodes 3 and 23. At the same time, an etching gas is supplied into the process chamber 2 via the gas supply pipe 24 of the upper electrode 23. As a result, the etching gas is formed into a plasma in the process chamber 2, and the semiconductor wafer W is etched by the resultant active species.

When the liquid nitrogen L is consumed as the semiconductor wafer W is cooled by the cooling block 200 during the etching process with respect to the semiconductor wafer W, and the liquid surface lowers, the level meter detects the liquid level. The electromagnetic valve 182 is then opened on the basis of the detection result so as to replenish the refrigerant reservoir portion 200A with the liquid nitrogen L, thereby always holding a predetermined amount of the liquid nitrogen L in the refrigerant reservoir portion 200A. In this case, even a small amount of moisture contained in the liquid nitrogen L will be frozen to become fine frozen particles, and the particles will flow in the refrigerant supply system 180. However, such fine frozen particles are reliably stopped by the filter 183, and the liquid nitrogen flows to the downstream side of the filter 183 to reach the electromagnetic valve 182. In this case, unlike the prior art, there is no possibility that the valve mechanism clogs with fine frozen particles to interfere with the operation of the electromagnetic valve 182. Therefore, the flow of the liquid nitrogen L can always be controlled by the electromagnetic valve 182 accurately to reliably supply the liquid nitrogen L into the refrigerant reservoir portion 200A, thereby always controlling the temperature of the semiconductor wafer W on the lower electrode 3 to a predetermined temperature. In addition, even if fine particles such as dust enter the supply pipe 181 and the like between the source of the liquid nitrogen L and the filter 183, such fine particles can be reliably removed.

Assume that in the refrigerant reservoir portion 200A, the liquid nitrogen L produces a nitrogen gas, owing to heat transferred to the supply pipe 183, while passing through the supply pipe 183. Even in such a case, since the nitrogen gas is temporarily stored in the space in the gas/liquid separating member 184 and is quickly dispersed into the refrigerant reservoir portion 200A via the capillaries of the gas/liquid separating member 184, and at the same time, the liquid nitrogen L is caused to flow into the refrigerant reservoir portion 200A via the capillaries of the gas/liquid separating member 184, the liquid nitrogen L can be quietly supplied along the circumferential surface of the downstream end of the supply pipe 181 without disturbing the liquid surface of the liquid nitrogen L, and the amount of the liquid nitrogen L can be accurately detected by the level meter to always hold a predetermined amount of the liquid nitrogen L in the refrigerant reservoir portion 200A. With this operation, a stable process can be performed with respect to the semiconductor wafer W.

As described above, according to the process apparatus of the embodiment, the filter 183 consisting of a sintered metal is arranged on the upstream side of the electromagnetic valve 182 of the supply pipe 181 of the refrigerant supply system 180, and the downstream end of the supply pipe 181 is placed in the refrigerant reservoir portion 200A. In addition, the gas/liquid separating member 184 consisting of a sintered metal is arranged on the downstream end of the supply pipe 181. with this arrangement, particle-like substances, e.g., fine frozen particles, contained in the liquid nitrogen L can be removed by the filter 183 on the upstream side of the driving portion, i.e., the electromagnetic valve 182, arranged midway along the supply path for the liquid nitrogen L, thus reliably driving the electromagnetic valve 182 and reliably supplying the liquid nitrogen L to the cooling block 200 by a predetermined flow rate. In addition, a nitrogen gas can be reliably separated from the liquid nitrogen L by the gas/liquid separating member 184 in the refrigerant reservoir portion 200A so as to quietly supply the liquid nitrogen L to the liquid surface of the stored liquid nitrogen L, thereby always holding a stable liquid surface and reliably managing the liquid surface of the liquid nitrogen L. With this operation, a stable process can always be performed with respect to the semiconductor wafer W at a predetermined low temperature.

The present invention is not limited to an etching apparatus and may be applied to a heat treatment apparatus such as a plasma CVD apparatus, an ashing apparatus, and the like as long as the apparatuses are designed to supply power through an RF power supply rod 5 and perform a plasma process with respect to an object to be processed, e.g., a semiconductor wafer and an LCD substrate. Note that since an RF power supply rod may cause condensation owing to moisture in the open air, the present invention can be applied to a case wherein no refrigerant reservoir is arranged in a susceptor support base. As a dry gas, a gas other than SF6, e.g., an inert gas such as a nitrogen gas, or air from which moisture is sufficiently removed, may be used.

According to the invention a discharge in the RF power supply rod can be prevented, a reduction in RF power supply efficiency can be suppressed and an impedance matching can be performed.

According to the invention condensation in the RF power supply rod can be prevented, thereby further reliably preventing a discharge in the RF power supply rod. In addition, corrosion of the RF power supply rod can be prevented.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A plasma process apparatus wherein RF power is applied to a process gas, thereby to convert the gas into plasma for processing an object, said apparatus comprising:
    a process chamber;
    an upper electrode located in said process chamber and having a gas-supplying section for supplying a process gas;
    a lower electrode located in said process chamber, having a cooling means, and opposing said upper electrode, for supporting an object; and
    RF power supplying means electrically connected to said lower electrode, protruding from said process chamber and connected to a RF power supply, for supplying RF power between said upper and lower electrodes,
    wherein said RF power supplying means includes an inner conductive rod, an outer conductive pipe surrounding said inner conductive rod and spaced therefrom, and a fixing member inserted between said inner conductive rod and said outer conductive pipe and having concaves and convexes, said inner conductive rod and said outer conductive pipe being electrically connected to an RF power supply source.

2. The apparatus according to claim 1, wherein said fixing member extends along said inner conductive rod, and said concaves and convexes are formed at that portion of said fixing member which is exposed to a space defined by said inner conductive rod and said outer conductive pipe.

3. The apparatus according to claim 1, wherein that portion of said process chamber which is covered with an insulating member and which supports said lower electrode is formed of a plurality of members each having a concave, which are fastened together by fastening members fitted in the concaves of said members.

4. The apparatus according to claim 3, wherein each of said fastening members is made of an elastic body covered with a metal layer.

5. The apparatus according to claim 4, wherein each of said fastening member is in full contact with inner surfaces of the concaves of said members, due to a restoring force of said elastic body.

6. The apparatus according to claim 1, further comprising gas-introducing means for introducing dry gas into a space defined by said inner conductive rod and said outer conductive pipe.

7. The apparatus according to claim 1, further comprising heating means for heating said RF power supplying means.

8. The apparatus according to claim 1, further comprising an electrically insulating vessel connected to said RF power supplying means, for receiving water drops generated in said RF power supplying means.

9. The apparatus according to claim 1, further comprising exhaustion means secured to said outer conductive pipe, for reducing pressure in a space defined by said inner conductive rod and said outer conductive pipe.

10. A plasma process apparatus wherein RF power is applied to a process gas, thereby to convert the gas into plasma for processing an object, said apparatus comprising:
    a process chamber;
    an upper electrode located in said process chamber and having a gas-supplying section for supplying a process gas;
    a lower electrode located in said process chamber, having a cooling means, and opposing said upper electrode, for supporting an object;
    RF power supplying means electrically connected to said lower electrode, protruding from said process chamber and connected to a RF power supply, for supplying RF power between said upper and lower electrodes; and
    impedance matching means for detecting an impedance difference between said RF power supply and said lower electrode and for adjusting at lest a variable capacitance, to thereby perform impedance matching,
    wherein said RF power supply includes a frequency changing section for changing an output frequency, and a control section for performing impedance matching by controlling the output power frequency, together with the variable capacitance, in accordance with the impedance difference detected between said RF power supply and said lower electrode, and said process chamber has a portion which is covered with an insulating member and which supports said lower electrode, said portion being formed of a plurality of members each having a concave, which are fastened together by fastening members fitted in the concaves of said members.

11. The apparatus according to claim 10, wherein said RF supply means includes an inner conductive rod, and an outer conductive pipe surrounding said inner conductive rod, said inner conductive rod and said outer conductive pipe being electrically connected to an RF power supply source.

12. The apparatus according to claim 11, wherein each of said fastening members is made of an elastic body covered with a metal layer.

13. The apparatus according to claim 12, wherein each of said fastening member is in full contact with inner surfaces of the concaves of said members, due to a restoring force of said elastic body.

14. The apparatus according to claim 11, further comprising gas-introducing means for introducing dried gas into a space defined by said inner conductive rod and said outer conductive pipe.

15. The apparatus according to claim 11, further comprising exhaustion means secured to said outer conductive pipe, for reducing pressure in a space defined by said inner conductive rod and said outer conductive pipe.

16. The apparatus according to claim 10, further comprising heating means for heating said RF power supplying means.

17. The apparatus according to claim 10, further comprising an electrically insulating vessel connected to said RF power supplying means, for receiving water drops generated in said RF power supplying means.

* * * * *